(12) United States Patent
Hershey et al.

(10) Patent No.: US 11,071,228 B2
(45) Date of Patent: Jul. 20, 2021

(54) COMPUTING WORKSTATION WITH ACCESSIBLE IN A RACK ENVIRONMENT

(71) Applicant: Apple Inc., Cupertino, CA (US)

(72) Inventors: Daniel D. Hershey, San Francisco, CA (US); Christoph M. Pistor, Santa Cruz, CA (US); Bartley K. Andre, Menlo Park, CA (US); Richard D. Kosoglow, San Jose, CA (US); Michael D. McBroom, Leander, TX (US); Shravan Bharadwaj, San Jose, CA (US); Jonathan L. Berk, Mountain View, CA (US); Houtan R. Farahani, San Ramon, CA (US); James M. Cuseo, San Jose, CA (US); William R. Allan, II, Half Moon Bay, CA (US); David C. Parell, Palo Alto, CA (US); Eric A. Knopf, Mountain View, CA (US); Seth G. McFarland, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/583,155

(22) Filed: Sep. 25, 2019

(65) Prior Publication Data
US 2020/0100383 A1  Mar. 26, 2020

Related U.S. Application Data

(60) Provisional application No. 62/736,820, filed on Sep. 26, 2018.

(51) Int. Cl.
*H05K 7/00* (2006.01)
*H05K 7/16* (2006.01)
(Continued)

(52) U.S. Cl.
CPC ............. *H05K 7/16* (2013.01); *H05K 7/1487* (2013.01); *H05K 7/1489* (2013.01); *H05K 9/0062* (2013.01)

(58) Field of Classification Search
None
See application file for complete search history.

(56) References Cited

U.S. PATENT DOCUMENTS 2,566,064 A * 8/1951 Keim ...................... H04B 1/03
361/724
2,572,617 A 10/1951 Haury et al.
(Continued)

*Primary Examiner* — Anthony Q Edwards
*Assistant Examiner* — Rashen E Morrison
(74) *Attorney, Agent, or Firm* — Dickinson Wright RLLP

(57) ABSTRACT

A rack system for one or more computing systems is described. The rack system may include support structures, or rack structures, and a housing affixed or un-affixed to the support structures. The rack system may include rails, including telescoping rails, affixed to the support structures and coupled to the computing system. When the rack system is in a closed position, the computing system is positioned within the housing. When the rack system is in an open position, the computing system is removed from the housing and the components of the computing system are accessible. In the open position, only components on one surface of the circuit board are accessible. However, the computing system can rotate, thereby placing the components on the opposing surface of the circuit board in an accessible position. Alternatively, the housing can be affixed to the computing system, and include modifications for access to the computing system.

19 Claims, 25 Drawing Sheets

(51) Int. Cl.
*H05K 9/00* (2006.01)
*H05K 7/14* (2006.01)

(56) References Cited

U.S. PATENT DOCUMENTS

| | | | | |
|---|---|---|---|---|
| 2,857,558 A * | 10/1958 | Fiske | ............... | B65D 85/38 |
| | | | | 361/727 |
| 5,169,221 A | 12/1992 | Wheeler | | |
| 5,786,995 A * | 7/1998 | Coleman | ............... | B64D 43/00 |
| | | | | 700/83 |
| 6,082,845 A * | 7/2000 | Eizadkhah | ............... | H05K 7/16 |
| | | | | 312/223.1 |
| 6,535,391 B2 * | 3/2003 | Larsen | ............... | G06F 1/184 |
| | | | | 312/223.1 |
| 6,788,544 B1 * | 9/2004 | Barsun | ............... | H05K 7/1421 |
| | | | | 361/727 |
| 6,826,055 B2 * | 11/2004 | Mease | ............... | G06F 1/184 |
| | | | | 312/223.1 |
| 6,862,187 B2 | 3/2005 | Robbins et al. | | |
| 6,922,336 B2 * | 7/2005 | Barsun | ............... | G06F 1/183 |
| | | | | 312/223.2 |
| 7,042,721 B2 * | 5/2006 | Olesiewicz | ............... | G06F 1/184 |
| | | | | 312/223.2 |
| 7,474,229 B2 * | 1/2009 | Franz | ............... | G06F 1/181 |
| | | | | 340/679 |
| 7,724,543 B2 * | 5/2010 | Ozawa | ............... | H04Q 1/035 |
| | | | | 361/826 |
| 8,538,226 B2 * | 9/2013 | Makrides-Saravanos | ............... | |
| | | | | G02B 6/4455 |
| | | | | 385/135 |
| 8,636,328 B2 * | 1/2014 | Ye | ............... | G11B 33/124 |
| | | | | 312/249.1 |
| 9,007,084 B2 * | 4/2015 | Babcock | ............... | G01R 31/2808 |
| | | | | 324/756.01 |
| 9,482,385 B2 * | 11/2016 | Braucht | ............... | H05K 5/0217 |
| 9,727,079 B2 * | 8/2017 | Lieber | ............... | G11B 33/128 |
| 9,781,857 B2 * | 10/2017 | Jau | ............... | H05K 7/1487 |
| 2005/0274680 A1 * | 12/2005 | Allen | ............... | A47B 96/068 |
| | | | | 211/26 |
| 2006/0010456 A1 * | 1/2006 | Ishimine | ............... | G11B 33/128 |
| | | | | 720/600 |
| 2007/0115627 A1 * | 5/2007 | Carlisi | ............... | H05K 7/1489 |
| | | | | 361/679.01 |
| 2008/0106871 A1 * | 5/2008 | James | ............... | H04Q 1/023 |
| | | | | 361/727 |
| 2010/0061064 A1 * | 3/2010 | Murano | ............... | H04Q 1/144 |
| | | | | 361/725 |
| 2012/0074078 A1 * | 3/2012 | Ye | ............... | G06F 1/187 |
| | | | | 211/26 |
| 2013/0070422 A1 | 3/2013 | Dunham et al. | | |
| 2014/0055959 A1 * | 2/2014 | Manda | ............... | G11B 33/128 |
| | | | | 361/728 |

\* cited by examiner

COMPUTING WORKSTATION WITH ACCESSIBLE IN A RACK ENVIRONMENT

CROSS-REFERENCE TO RELATED APPLICATION(S)

This application claims the benefit of priority to U.S. Provisional Application No. 62/736,820, filed on Sep. 26, 2018, and titled "COMPUTING WORKSTATION WITH ACCESSIBLE IN A RACK ENVIRONMENT," the disclosure of which is incorporated herein by reference in its entirety.

FIELD

The following description relates to computing assemblies. In particular, the following description relates to a computing assembly for use as a standalone workstation and also for use in a rack environment. The computing assembly may include several computing systems in the rack environment. The computing system can be removed from a housing attached to the rack environment, while still attached to rails (or slides) of the rack environment, allowing access various components of the computing system. Moreover, the computing system is rotatable relative to the rack environment such that multiple surfaces of the computing system are accessible, thereby allowing access to components mounted on the multiple surfaces for the purpose of maintenance and/or upgrading the various components. The computing assembly can be further modified such that housing moves in conjunction with the computing system. In these instances, the housing is modified to provide access to components of the computing system.

BACKGROUND

Rack unit computers can be used as a file server or a web server. Typically, rack unit computers are stacked in a server room. In large-scale systems, several hundred or more computers can be used for one or more applications. Also, these rack unit computers are often stored in large enclosures, such as cabinets. Collectively, rack unit computers can be used for a designated application(s).

However, traditional rack unit computers, and their collective layout, have certain drawbacks. For instance, when rack unit computers are stored in an enclosure, they must be removed from the enclosure to gain access. Additionally, in order for a user to perform an operation on the computer, the housing must be detached (e.g., unscrewed or unfastened) from the rack unit computer to gain access to the processing components of the computer. Once the user operation(s) is/are performed, the housing must again be re-attached, and the rack unit computer must be re-installed in the enclosure. Further, when the rack unit computer is part of a large-scale system, the operator cannot gain access to the rear side (often where expansion slots for additional components are installed), and must walk around several vertically built, side-by-side rack unit computers.

SUMMARY

In one aspect, a rack system is described. The rack system may include support structures. The rack system may further include a housing attached to the support structures. The rack system may further include a computing assembly that is located in the housing. The computing assembly may include a circuit board having a first surface and a second surface opposite the first surface. The computing system may further include a first component located on the first surface. The computing system may further include a second component located on the second surface. In some instances, a removal of the computing system from the housing may include a first access position of the first component. Also, in some instances, a rotation of the computing system may include a second access position of the second component. The second access position may be different from the first access position.

In another aspect, a rack system is described. The rack system may include a first support structure having a first rail coupled to a computing system. The rack system may further include a second support structure having a second rail coupled to the computing system. The rack system may further include a housing coupled with the first support structure and the second support structure. In some instances, a closed position may include the housing receiving computing system. Also, in some instances, an open position may include the computing system removed from the housing and capable of rotation with respect to the first support structure and the second support structure.

In another aspect, a rack system is described. The rack system may include a first support structure having a first rail. The rack system may further include a second support structure having a second rail. The rack system may further include a housing coupled to the first support structure and the second support structure. The rack system may further include a computing system capable of removal from the housing. The computing system may include a circuit board having a first surface and a second surface opposite the first surface. Also, the computing system can be rotationally coupled with the first rail and the second rail to provide i) a first access to a first component on the first surface, and ii) a second access to a second component on the second surface.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
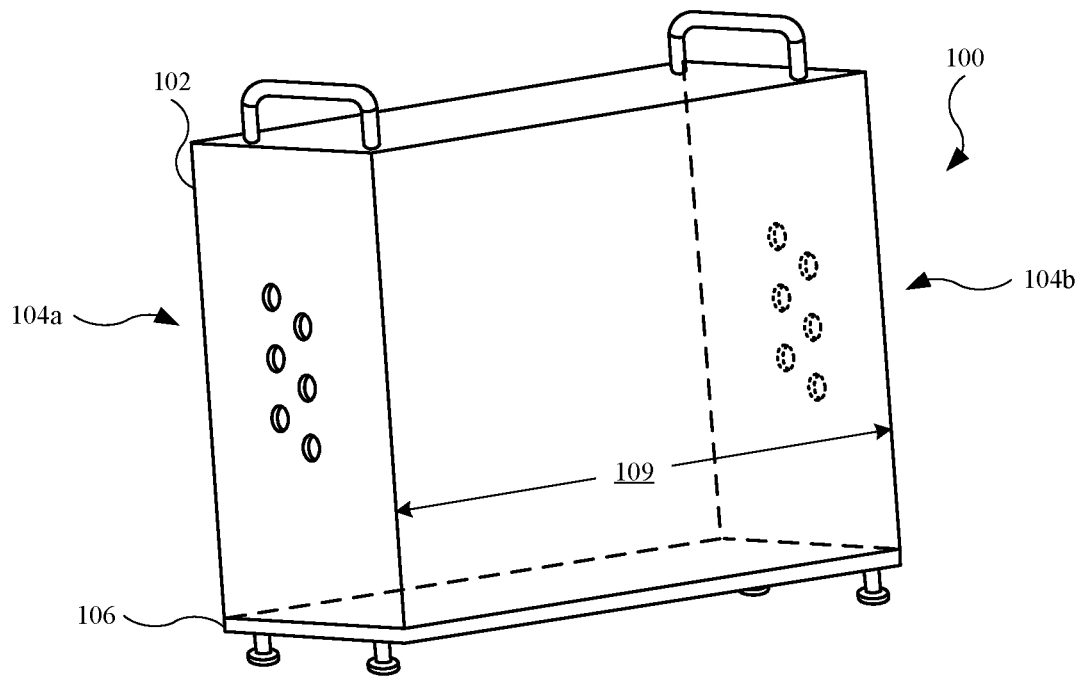
FIG. 1 illustrates an isometric view of an embodiment of a computing assembly, in accordance with some described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to computing systems. In particular, the following disclosure relates to computing systems with modifications designed to facilitate access to its components. This includes instances in which the computing system is used as server hardware that is part of a rack computing system. Oftentimes, traditional computing systems integrated into a rack computing system have inherent difficulties with respect to gaining access (to the traditional computing systems). However, a computer system and/or a rack system described herein is/are designed to overcome these difficulties.

A rack system may include one or more support structures, such as vertical rails, used to mount one or more computing systems. In some instances, the support structures are mounted in an enclosure, or cabinet. The rack system further includes rails mounted onto the support structures. The rails may include sliding rails or telescoping rails that secure to the computing system. In this regard, the computing system may slide out from the support structures (or slide out from the enclosure/cabinet, when used).

A traditional computing system includes a housing that covers the components of the computing system, thereby making them internal components. The housing may include one or more housing parts that secured together to provide a protective housing and a form factor that defines the general size and shape of the traditional computing system. The housing parts generally define the outer perimeter of the traditional computing system. Internal structures, such as bracket, fasteners, clips, locks, or the like, couple circuit boards and other internal structures to the housing parts such that the circuit boards, and components mounted thereon, are fixed in the housing. However, the housing used for computing systems described herein are coupled to the support structures of the rack system. In this manner, when the computing system slides out from the support structures (or from the enclosure), the housing remains fixed to the support structures (or remains in the enclosure), and the components mounted on a surface of a circuit board of the computing system are readily accessible. Also, the coupling/securing between the computing system and each rail may include allow the computing system to be rotated, and subsequently, the components mounted on an additional (opposite) surface of the circuit board are also readily accessible. As a result, the components of the computing system can be mounted on both sides of the circuit board, and are readily accessible for service/maintenance, troubleshooting, and/or upgrading.

Alternatively, some computing assemblies described herein may include modified housing components that facilitate accesses to the components of the computing assembly. For example, the housing component may include a hatch that can disengage from the remaining housing components, thereby allowing user access to the components. Alternatively, or in combination, the computing assembly may include one or more latch assemblies that allow for disengagement between the housing components and other external structures of the computing assembly.

These and other embodiments are discussed below with reference to FIGS. 1-38. However, those skilled in the art will readily appreciate that the detailed description given herein with respect to these Figures is for explanatory purposes only and should not be construed as limiting.

FIG. 1 illustrates an isometric view of an embodiment of a computing assembly 100, in accordance with some described embodiments. The computing assembly 100 may be referred to as a computer workstation, a desktop computer, or the like. As shown, the computing assembly 100 may include a housing 102 that provides a protective cover for several components (not shown in FIG. 1) of a computing system (covered by the housing 102), such as circuit boards, processor circuits (including central processing units, graphics processing units), memory circuits, batteries, fans, audio modules, and flexible circuits, as non-limiting examples. The housing 102 may include openings 104a and openings 104b that allows airflow into and out of the housing 102 in order to cool components of the computing assembly 100. The computing assembly 100 may include a platform 106 on which the housing 102 is mounted. Also, the housing 102 is defined in part by a dimension 109. This will be discussed below.

Figure 2:
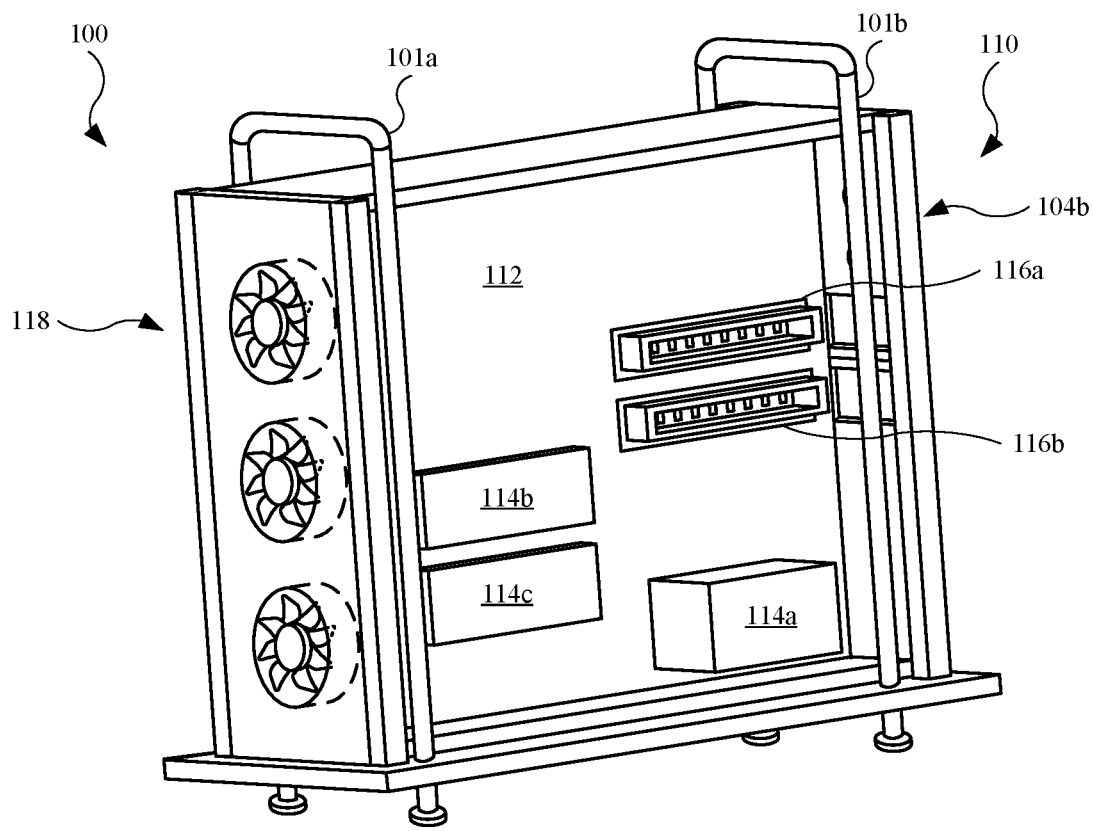
FIG. 2 illustrates an isometric view of the computing assembly shown in FIG. 1, showing the housing removed.

FIG. 2 illustrates an isometric view of the computing assembly 100 shown in FIG. 1, showing the housing 102 removed. As shown, the computing assembly 100 may include a handle 101a and a handle 101b, both of which are used to facilitate transporting the computing assembly 100. Further, the handle 101a and the handle 101b can extend along the computing assembly 100 to define several "legs" on which the computing assembly 100 is positioned. The computing assembly 100 further includes a computing system 110. The computing system 110 may include a circuit board 112 with several components mounted on the circuit board 112, at least some of which are in communication with each other. For example, the computing system 110 may include a component 114a, such as a power supply, mounted on the circuit board 112. The computing system 110 may further include a component 114b and a component 114c. Each of the component 114b and the component 114c may include a graphics processing unit or a central processing unit, as non-limiting examples. The computing system 110 may further include a connector 116a and a connector 116b. Each of the connector 116a and the connector 116b serves as an expansion slot to receive an additional module, such as a graphics card or a network communication card, as non-limiting examples. The computing system 110 may further include a fan assembly 118 electrically coupled to the circuit board 112. The fan assembly 118 may include multiple fan modules. The fan modules may be designed to drive airflow through the openings 104a of the housing 102 (shown in FIG. 1) and into the computing system 110 across the aforementioned components and connectors. The airflow convectively carries heat generated by the components out of the openings 104b (shown in FIG. 1).

Figure 3:
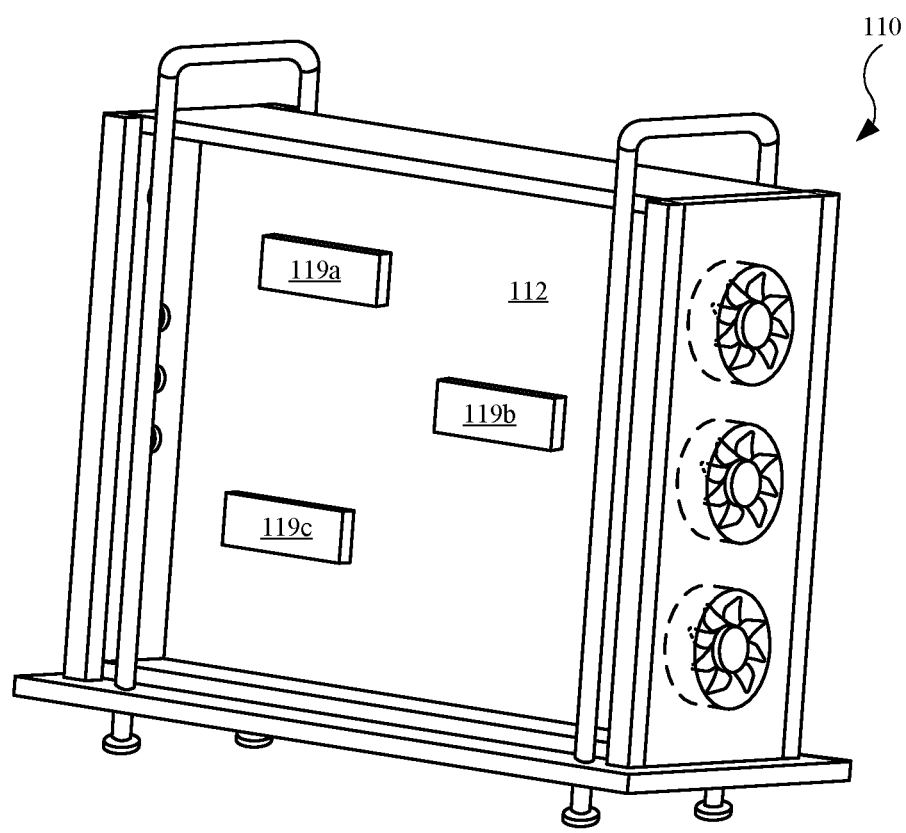
FIG. 3 illustrates an alternate isometric view of the computing assembly shown in FIG. 1, showing an additional surface of the circuit board and additional components on the additional surface.

As shown, the components and connectors are mounted to a surface of the circuit board 112. In order to increase the number of components, which may increase the performance of the computing system 110, additional components can be mounted onto an additional surface of the circuit board 112. For example, FIG. 3 illustrates an alternate isometric view of the computing system 110 shown in FIG. 1, showing an additional surface of the circuit board 112 and additional components mounted on the additional surface. As shown, a memory module 119a, a memory module 119b, and a memory module 119c are mounted on the circuit board 112. Each of the memory module 119a, the memory module 119b, and the memory module 119c may include a random-access memory, solid-state drive, or a dual in-line memory module, as non-limiting examples. In this regard, in some embodiments, the processing components and power supply are mounted on one surface of the circuit board 112, while the memory modules are mounted on an opposing surface of the circuit board 112. This may prevent issues such as overheating of some modules and/or interference (e.g., noise). Also, it should be noted that the components, connectors and power supply on one surface of the circuit board 112 (shown in FIG. 2) can be in electrical communication with the memory module 119a, the memory module 119b, and the memory module 119c (and any additional modules or components not shown) on the surface of the circuit board 112 shown in FIG. 3. Also, in some embodiments, each surface of the circuit board 112 includes a combination of power supplies, components (processing circuits), and/or memory modules.

FIGS. 2 and 3 illustrate that when the housing 102 (shown in FIG. 1) is removed, the components, connectors, memory modules, and other devices (not shown) mounted on either surface of the circuit board 112 are readily accessible for reasons such as replacements/upgrades and service/maintenance/repair. With the housing 102 removed, minimal, if any, obstruction to a user is present, and the user can access components on either side of the circuit board 112. Moreover, if the user is facing one surface of the circuit board 112, the user can simply rotate the computing assembly 100 to access the other surface of the circuit board 112. Also, the number of components, circuits, and connectors shown in FIGS. 2 and 3 are exemplary and should not be construed as limiting.

Figure 4:
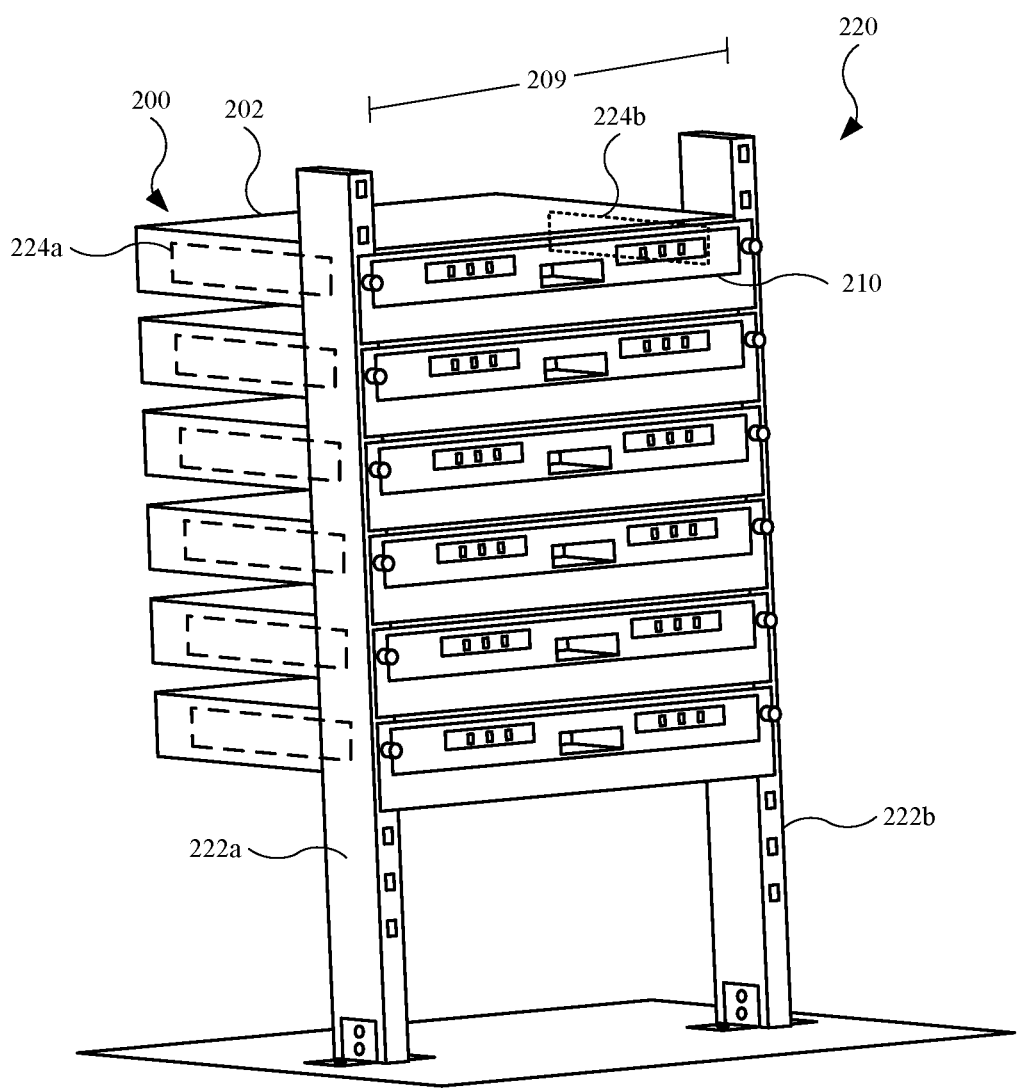
FIG. 4 illustrates an isometric view of an embodiment of a rack system carrying several computing assemblies, in accordance with some described embodiments.

FIG. 4 illustrates an isometric view of an embodiment of a rack system 220 carrying several computing assemblies, in accordance with some described embodiments. As shown, the rack system 220 includes a support structure 222a and a support structure 222b. The support structure 222a and the support structure 222b may include vertically mounted rails. Several computing assemblies, including a computing assembly 200, are held by the rack system 220 via the support structure 222a and the support structure 222b. As shown, the support structure 222a and the support structure 222b are mounted to a floor. However, the support structure 222a and the support structure 222b can be suspended from a ceiling (not shown in FIG. 4) or secured to a vertical wall (not shown in FIG. 4).

The rack system 220 may include several rails. For example, the rack system 220 includes a rail 224a and a rail 224b (shown as dotted lines). The rails can be located in a housing of a computing assembly. For example, the rail 224a and the rail 224b are located in a housing 202 of the computing assembly 200. Further, the rail 224a and the rail 224b may be connected to the support structure 222a and the support structure 222b, respectively, and/or to the housing 202 by fasteners (not shown in FIG. 4). The remaining computing assemblies may be connected to a pair of rails, with each pair of rails also connected to the support structure 222a and the support structure 222b.

Each housing of a computing assembly is attached to the support structures. For example, the housing 202 is attached to the support structure 222a and the support structure 222b. The rails include sliding rails, or telescoping rails, that allow the relative movement of the computing assemblies. Each computing assembly includes a computing system within a housing. Furthermore, the rails allow relative movement of each computing system with respect to their housing, as well as with respect to the support structures. For example, the rail 224a and the rail 224b allow movement of the computing system 210 such that the computing system 210 slides out of the housing 202. Accordingly, the computing system 210 (representative of computing systems described herein) is not attached to the housing 202, and the housing 202 remains stationary while the computing system 210 moves into and out of the housing 202. An exemplary embodiment will be shown below.

The support structure 222a is separated from the support structure 222b by a distance 209. The distance 209 defines a dimension that is at least as large has the dimension 109 of the computing assembly 100 (shown in FIG. 1). In this regard, the computing system 110 shown in FIG. 2 can be mounted to the rack system 220, and into a housing of the rack system 220. Further, the computing system 210 can be removed from the housing 202 and can fit into the housing 102 (shown in FIG. 1). Accordingly, a computing assembly described herein may include a computing system that is interchangeable, and can be used in standalone workstations and in rack systems. Also, the rack system 220 is shown with several additional computing assemblies that are not labeled. These computing assemblies may include any features and functionality shown and described for the computing assembly 200.

Figure 5:
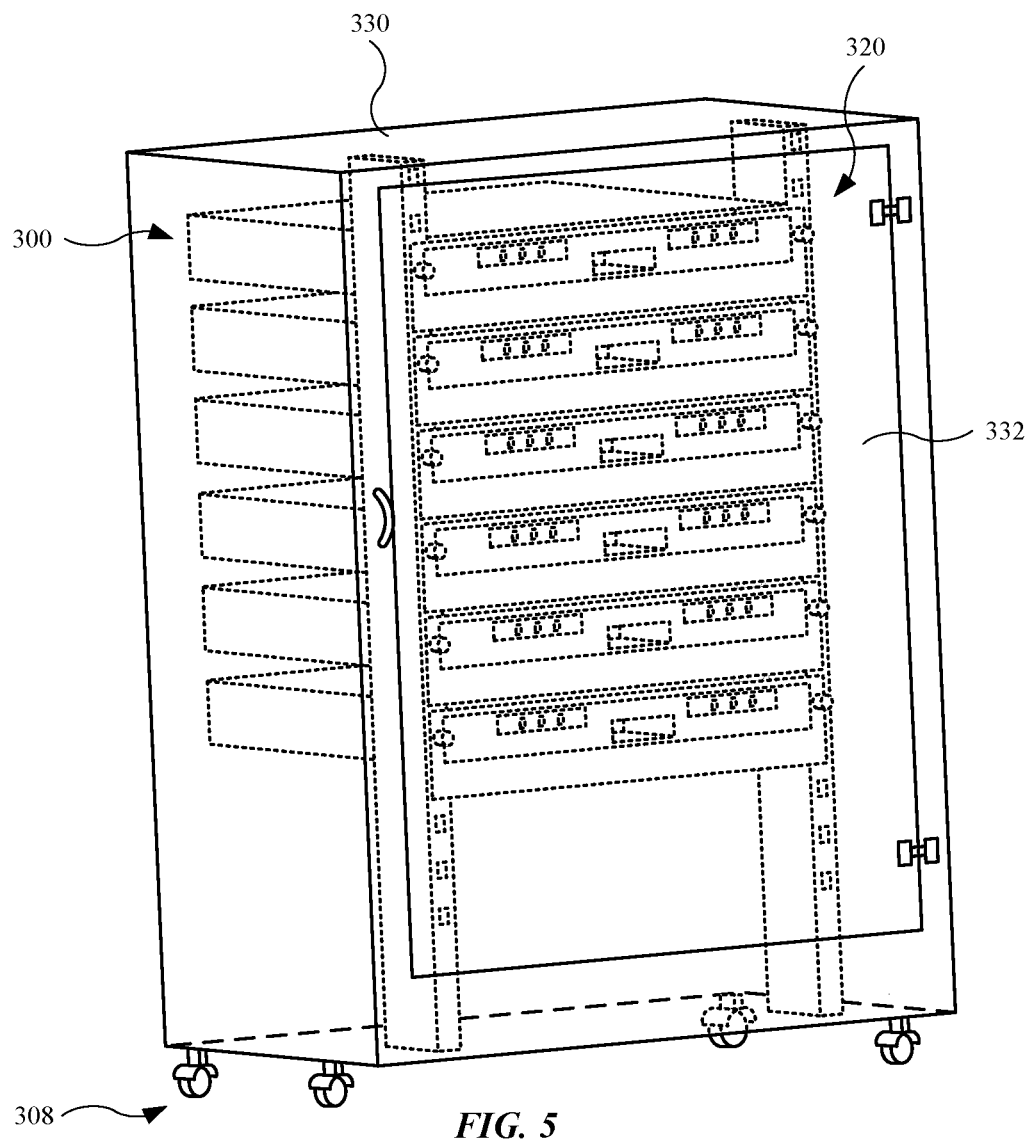
FIG. 5 illustrates an isometric view of an embodiment of a rack system carrying several computing assemblies, with the rack system in an enclosure, in accordance with some described embodiments.

FIG. 5 illustrates an isometric view of an embodiment of a rack system 320 carrying several computing assemblies, with the rack system 320 in an enclosure 330, in accordance with some described embodiments. As shown, the enclosure 330 defines a cabinet used for protection and/or securing of the computing assemblies. The enclosure 330 includes a door 332 that can open, thereby providing access to a computing assembly 300 and several additional computing assemblies (not labeled). The rack system 320 shown in FIG. 5 may include any features and structural components previously described for the rack system 220 (shown in FIG. 4). Further, the rack system 320 may include a mobile rack system with wheels 308. However, although not shown, the wheels 308 may be replaced with standoffs.

Figure 6:
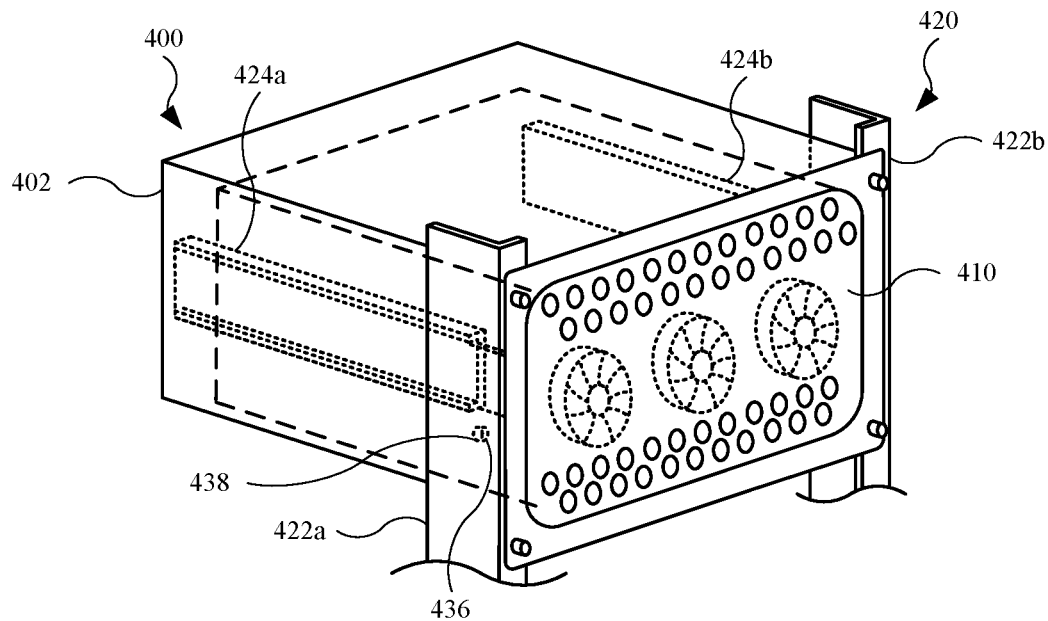
FIG. 6 illustrates an isometric view of an embodiment of a rack system carrying a computing assembly, in accordance with some described embodiments.

FIG. 6 illustrates an isometric view of an embodiment of a rack system 420 carrying a computing assembly 400, in accordance with some described embodiments. The rack system 420 and the computing assembly 400 may include several features described herein for a rack system and a computing assembly, respectively. As shown, the rack system 420 includes a support structure 422a and a support structure 422b. The computing assembly 400 includes a housing 402 that is secured to the support structure 422a and the support structure 422b. The rack system 420 further includes a rail 424a and a rail 424b. The rail 424a and the rail 424b may be connected to the support structure 422a and the support structure 422b, respectively, and/or to the housing 402 by fasteners (not shown in FIG. 6). The computing assembly 400 includes a computing system 410 that is connected to the rail 424a and the rail 424b. As shown, the computing system 410 is disposed in the housing 402, representing a closed position of the computing assembly 400. The closed position may also refer to a position in which the computing system 410 is positioned between the support structure 422a and the support structure 422b. In the closed position, the computing system 410 is operable to serve in its intended computing functions, such as processing instructions in accordance with a file server or a web server, as non-limiting examples. Also, the computing system 410 may include a sensor 436 designed to sense a target 438 on the rack system 420. This will be discussed below.

Figure 7:
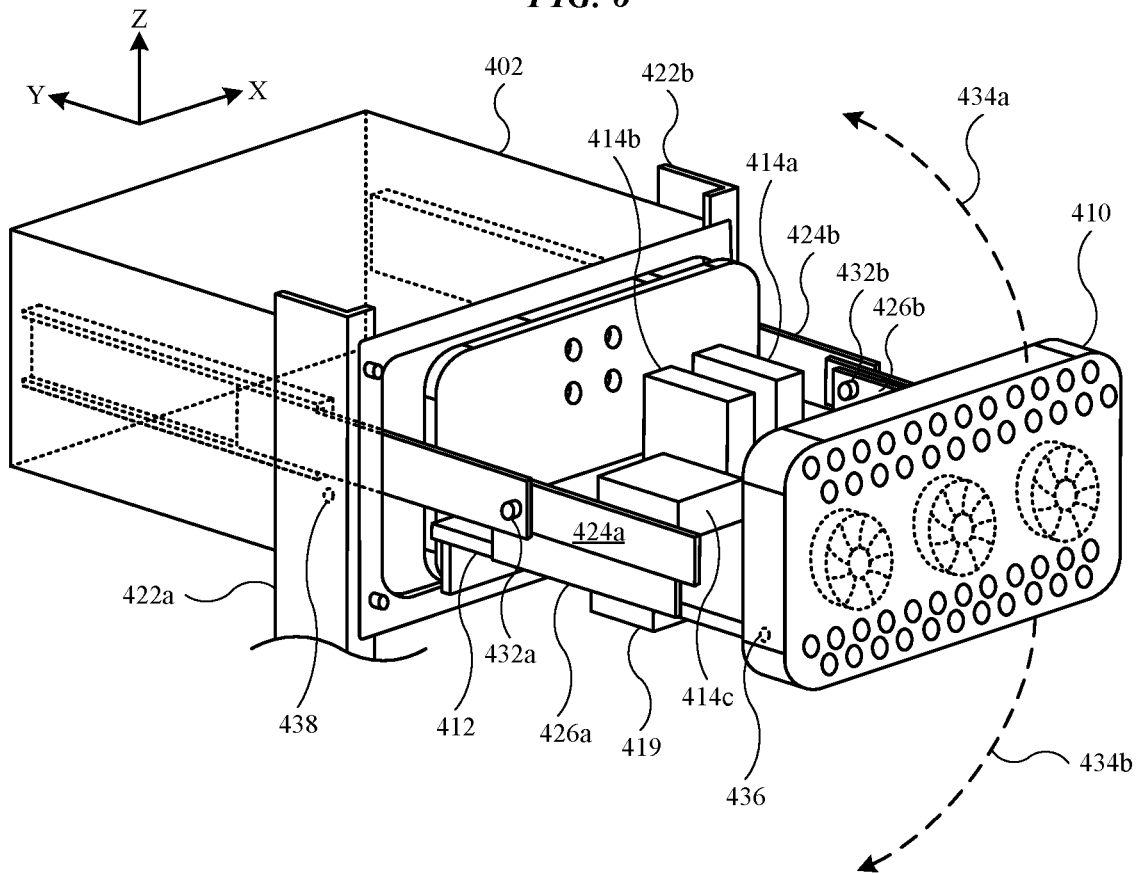
FIG. 7 illustrates the rack system and the computing assembly shown in FIG. 6, showing the computing system removed from the housing.

The computing assembly 400 is designed to transition from the closed position to an open position. For example, FIG. 7 illustrates the rack system 420 and the computing assembly 400 shown in FIG. 6, showing the computing system 410 removed from the housing 402. The rail 424a and the rail 424b permit relative movement of the computing system 410 with respect the housing 402 such that the computing system 410 is out of the housing 402, representing an open position of the computing assembly 400. Also, the open position may also refer to a position in which the computing system 410 is not positioned between the support structure 422a and the support structure 422b.

When the computing assembly 400 is in the open positioned, the components of the computing system 410 are accessible. For example, the computing system 410 includes circuit board 412, as well as a component 414a, a component 414b, and a component 414c mounted on a surface the circuit board 412. Each of the component 414a, the component 414b, and the component 414c may include a power supply or processing circuitry (such as a graphics processing unit or a central processing unit), as non-limiting examples. With the computing assembly 400 in the open position, a user can readily access the component 414a, the component 414b, and the component 414c for replacements/upgrades and service/maintenance. Based on the open position, the computing system 410 is unobstructed from the housing 402 and the rack system 420.

Each of the rail 424a and the rail 424b may include a telescoping rail with multiple rail components that move relative to each other. Furthermore, the rail 424a and the rail 424b are connected to a structure 426a and a structure 426b, respectively, of the computing system 410. As shown, the rail 424a is connected to the structure 426a by a coupling mechanism 432a, and the rail 424b is connected to the structure 426b by a coupling mechanism 432b. Each of the coupling mechanism 432a and the coupling mechanism 432b may include a cantilevered coupling mechanism. In this regard, the coupling mechanism 432a and the coupling mechanism 432b allow rotation of the computing system 410 with respect to the rail 424a and the rail 424b, and in turn, the computing system 410 can rotate with respect to other features such as the housing 402, the support structure 422a, and the support structure 422b. Accordingly, the computing system 410 can be oriented in a different manner. For instance, the computing system 410 can be rotated in a direction 434a to provide a user access to a different surface of the circuit board 412 such that the user can access a memory module 419 on the different surface. Alternatively, the computing system 410 can be rotated in a direction 434b (opposite the direction 434a) to provide the user with an alternate access of the component 414a, the component 414b, and the component 414c. The rotation of the computing system 410 in the direction 434a or the direction 434b may include a 90-180 degree rotation relative to the initial position of the computing system 410 shown in FIG. 7.

In FIG. 7, the computing system 410 lies on an X-Y plane (in Cartesian coordinates). Further, the computing system 410 is parallel, or at least substantially parallel, with respect to the rail 424a, the rail 424b, and the housing 402. Further, the computing system 410 is perpendicular, or at least substantially perpendicular, with respect to the support structure 422a and the support structure 422b. However, a 90-degree rotation of the computing system 410 (placing the computing system 410 on an X-Z plane), causes the computing system 410 to be perpendicular, or at least substantially perpendicular, with respect to the rail 424a, the rail 424b, and the housing 402, and causes the computing system 410 to be parallel, or at least substantially parallel, with respect to the support structure 422a and the support structure 422b.

In the open position, the computing system 410 may transition to a reduced power mode, and the operations of the computing system 410 may be reduced for purposes of safety or thermal considerations. In this manner, the sensor 436 can detect the presence of the target 438 on the rack system 420. The sensor 436 may include a Hall Effect sensor and the target 438 may include a magnet. In the closed position, the sensor 436 can detect a magnetic field (not shown in FIG. 7) of the target 438, and provide an input signal to a processor circuit the computing system 410. The computing system 410 can use the input signal to determine the computing system 410 is in the housing 402 and the computing assembly 400 is in the closed position. If the sensor 436 does not detect the target 438, the computing system 410 does not receive input signal from the sensor 436, and can determine the computing system 410 is not the housing 402, corresponding to the computing assembly 400 being in the open position.

Figure 8:
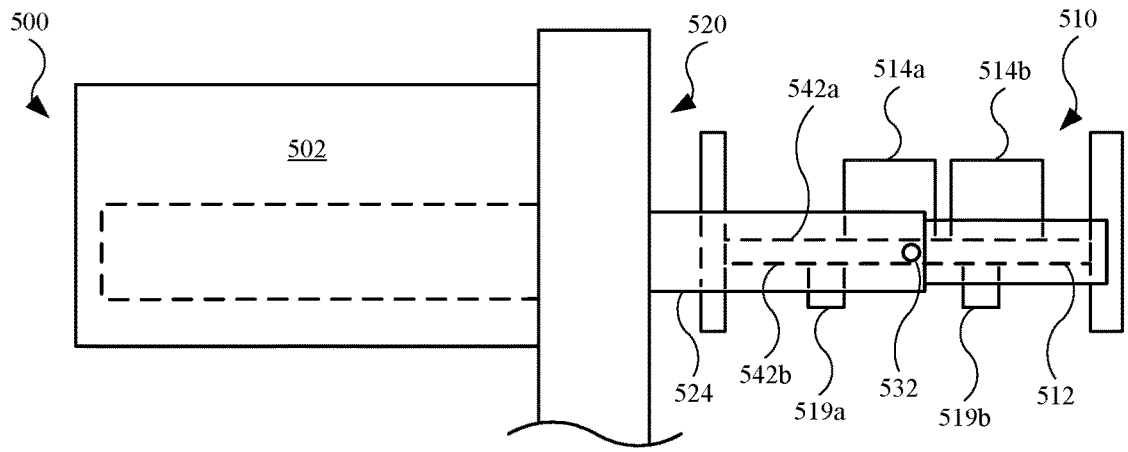
FIG. 8 illustrates a side view of an embodiment a rack system and a computing assembly, showing a computing system of the computing assembly removed from a housing, in accordance with some described embodiments.
Figure 9:
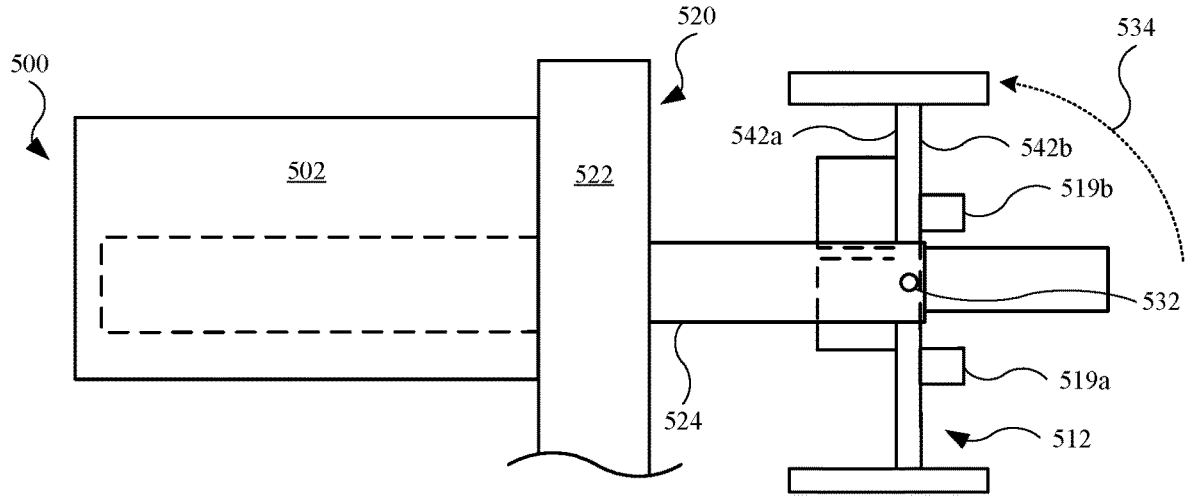
FIG. 9 illustrates a side view of the rack system and the computing assembly shown in FIG. 8, showing the computing system rotated with respect to the rack system.
Figure 10:
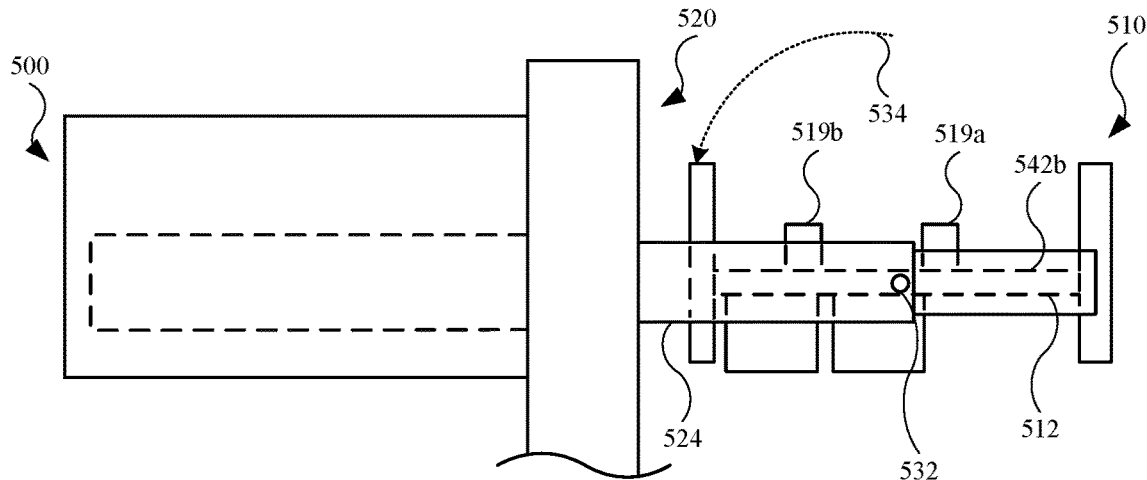
FIG. 10 illustrates a side view of the rack system and the computing assembly shown in FIG. 9, showing the computing system further rotated with respect to the rack system.

FIGS. 8-10 illustrate an exemplary rotation of a computing system 510 relative to a rack system 520 and its components. The exemplary rotation of the computing system 510 may be applied to other computing systems described herein.

FIG. 8 illustrates a side view of an embodiment a rack system 520 and a computing assembly 500, showing a computing system 510 of the computing assembly 500 removed from a housing 502, in accordance with some described embodiments. The housing 502 may include a housing for computing assemblies described herein. As shown, the computing assembly 500 is in the open position. The computing system 510 includes a circuit board 512. The computing system 510 further includes a component 514a and a component 514b mounted on a surface 542a of the circuit board 512, as well as a memory module 519a and a memory module 519b mounted on a surface 542b of the circuit board 512. The surface 542a and the surface 542b may be referred to, collectively, as opposing surfaces.

Generally, a user, when facing the computing system 510 has access to the component 514a and the component 514b, and any other components on the surface 542a. The user's access to the memory module 519a and the memory module 519b, and any other components on the surface 542b, is limited. However, the computing system 510 can be rotated to place the computing system 510 in a different orientation. For example, FIG. 9 illustrates a side view of the rack system 520 and the computing assembly 500 shown in FIG. 8, showing the computing system 510 rotated with respect to the rack system 520. The computing system 510 is rotated in a direction 534 such that when facing the computing system 510, the user has access to the memory module 519a and the memory module 519a, and any other components on the surface 542b. Further, as shown, when the computing system 510 is rotated in the direction 534, the surface 542a faces the rack system 520 (including a support structure 522 of the rack system 520) and the housing 502, and the surface 542b faces away from the rack system 520 and the housing 502.

FIG. 10 illustrates a side view of the rack system 520 and the computing assembly 500 shown in FIG. 9, showing the computing system 510 further rotated with respect to the rack system 520. As shown, the computing system 510 is further rotated in the direction 534. Again, the user has access to the memory module 519a and the memory module 519a, and any other components on the surface 542b. However, the circuit board 512 is oriented in a different manner, as compared to the manner shown in FIG. 9, thereby providing a different access orientation to the circuit board 512. Based on the rotation shown FIG. 10, the computing system 510 is capable of 180-degree rotation.

FIGS. 8-10 show the computing system 510 coupled to a rail 524 by a coupling mechanism 532. As shown, the coupling mechanism 532 is center mounted with respect to the computing system 510. In other words, the coupling mechanism 532 is located at a midpoint taken along a dimension (or dimensions) of the computing system 510. This may allow for easier rotation of the computing system

510, as the required torque to rotate the computing system 510 is reduced (as compared to the coupling mechanism 532 being located near an end, or off-center with, the computing system 510). It should be noted that an additional rail and coupling mechanism (not shown in FIGS. 8-10) can be present.

Figure 11:
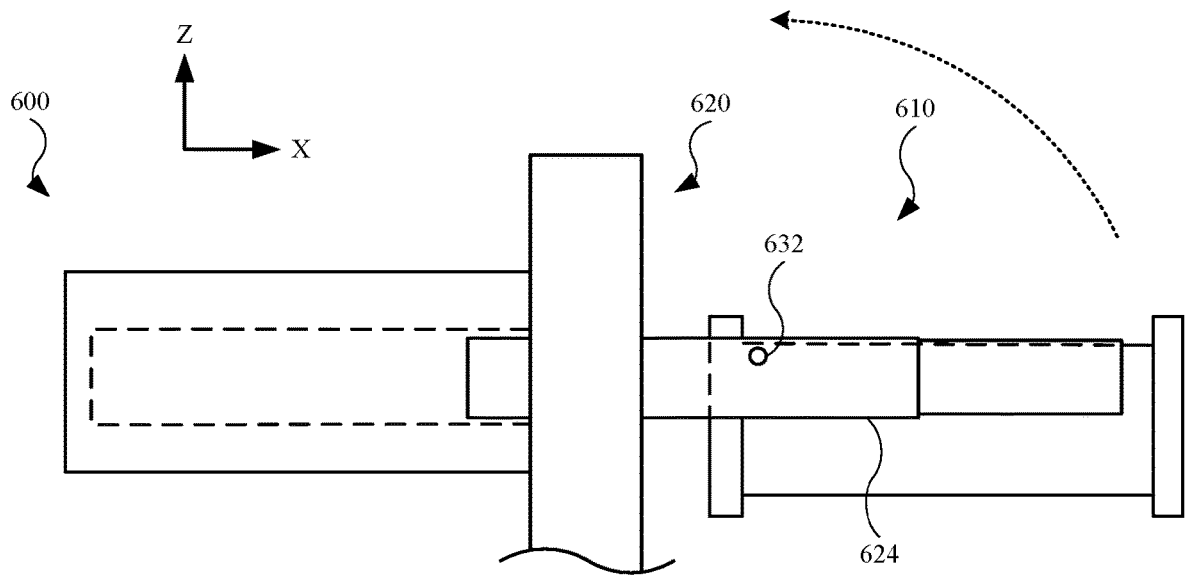
FIG. 11 illustrates a side view of an alternate embodiment a rack system and a computing assembly, showing a computing system of the computing assembly connected to the rack system at an alternate location, in accordance with some described embodiments.
Figure 12:
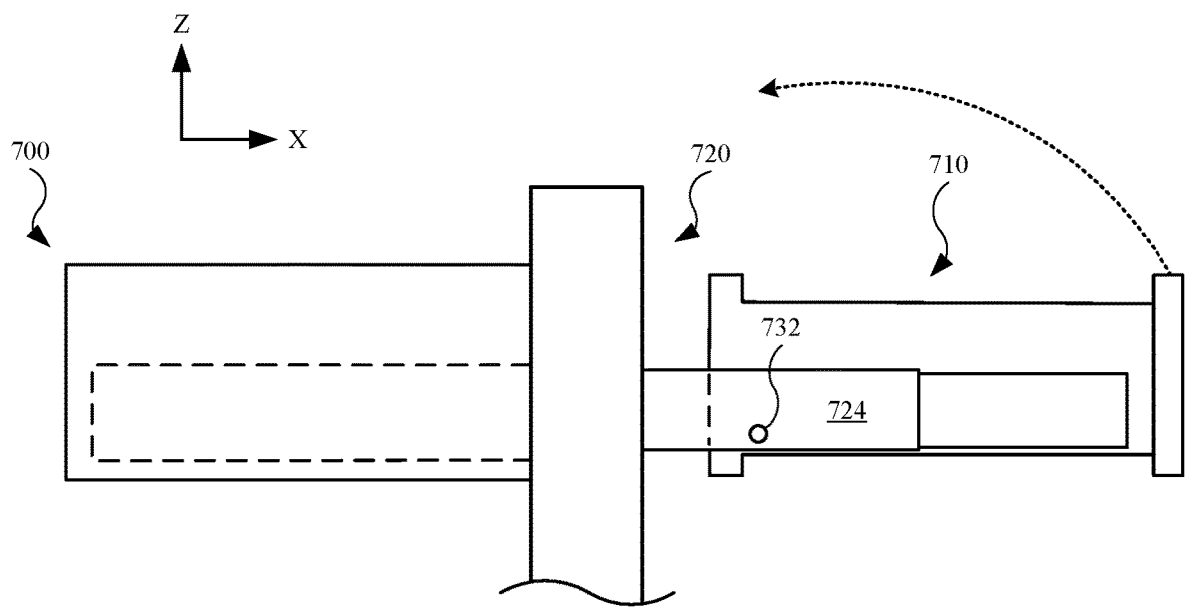
FIG. 12 illustrates a side view of an alternate embodiment a rack system and a computing assembly, showing a computing system of the computing assembly connected to the rack system at an alternate location, in accordance with some described embodiments.

FIGS. 11 and 12 illustrate alternate locations to which a coupling mechanism can be secured to a computing system. The computer assemblies and rack systems shown in FIGS. 11 and 12 may include features described herein for a computer assembly and a rack system, respectively.

FIG. 11 illustrates a side view of an alternate embodiment a rack system 620 and a computing assembly 600, showing a computing system 610 of the computing assembly 600 connected to the rack system 620 at an alternate location, in accordance with some described embodiments. As shown, a coupling mechanism 632 couples a rail 624 of the rack system 620 to the computing system 610. The coupling mechanism 632 is mounted to an upper portion of the computing system 610, and further, is mounted off-center. As a result, the position of the computing system 610 is relatively lower (vertically, along the Z-axis), as compared to a prior embodiment, thereby improving accessibility as computing system 610 is less elevated.

FIG. 12 illustrates a side view of an alternate embodiment a rack system 720 and a computing assembly 700, showing a computing system 710 of the computing assembly 700 connected to the rack system 720 at an alternate location, in accordance with some described embodiments. As shown, a coupling mechanism 732 couples a rail 724 of the rack system 720 to the computing system 710. The coupling mechanism 732 is mounted to a lower portion of the computing system 710, and further, is mounted off-center. The may prevent the computing system 710 from contacting a floor surface when the computing system 710 is mounted close to a floor, as the computing system is elevated in the Z-axis, as compare to the computing system 610 (shown in FIG. 11).

Figure 13:
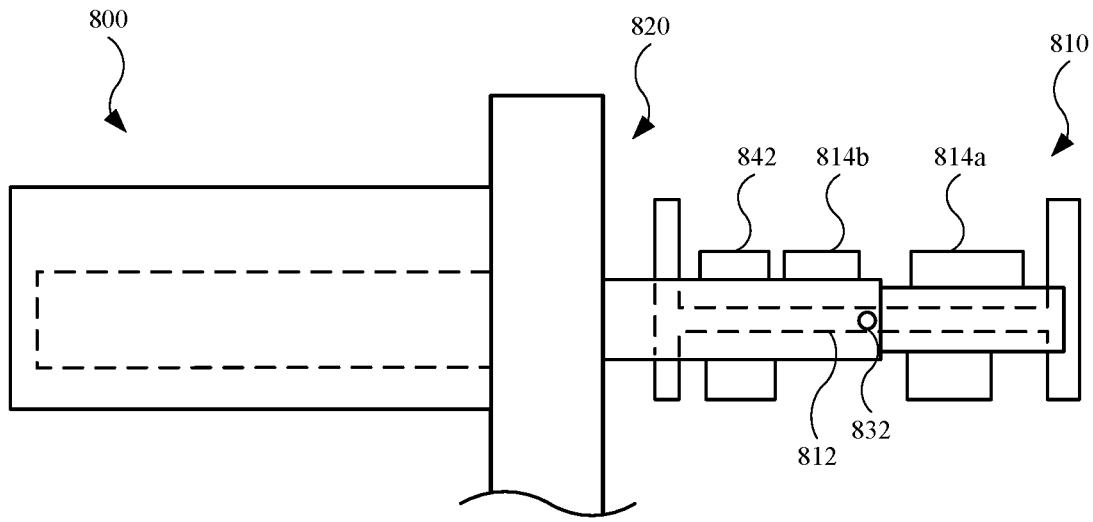
FIG. 13 illustrates a side view of an alternate embodiment a rack system and a computing assembly, showing a counterbalance added to a computing system of the computing assembly, in accordance with some described embodiments.
Figure 14:
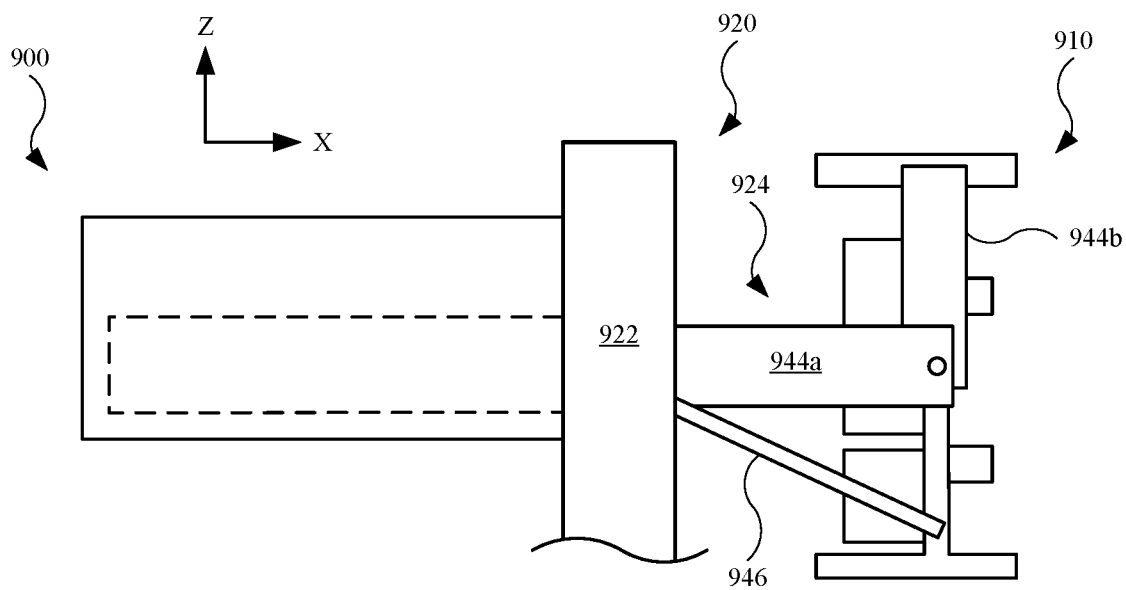
FIG. 14 illustrates a side view of an alternate embodiment a rack system and a computing assembly, showing multiple enhancements to the rack system, in accordance with some described embodiments.

FIGS. 13 and 14 illustrate features that may assist in rotating a computing system. The computer assemblies and rack systems shown in FIGS. 13 and 14 may include features described herein for a computer assembly and a rack system, respectively.

FIG. 13 illustrates a side view of an alternate embodiment a rack system 820 and a computing assembly 800, showing a counterbalance 842 added to a computing system 810 of the computing assembly 800, in accordance with some described embodiments. As shown, the computing system 810 includes a circuit board 812. The circuit board 812 includes a component 814a mounted on one section of the circuit board 812 and a component 814b mounted on another section of the circuit board 812. In some instances, the weight of the component 814a outweighs the weight of the component 814b. In these instances, the counterbalance 842 is applied to the section of the computing system 810 with the component 814b to even the weight on both sections. Generally, the counterbalance 842 is added such that the weight of the computing system 810 is evenly distributed on each section, with each section separated by a coupling mechanism 832. By balancing the weight with the counterbalance 842 in this manner, the rotational velocity of the computing system 810 is consistent, and unwanted high- and low-velocity rotations may be avoided.

FIG. 14 illustrates a side view of an alternate embodiment a rack system 920 and a computing assembly 900, showing multiple enhancements to the rack system 920, in accordance with some described embodiments. As shown, the rack system 920 includes a rail 924 that includes a first rail component 944a and a second rail component 944b. When a computing system 910, coupled to the rail 924, is rotated, the first rail component 944a remains stationary, while the second rail component 944b rotates with the computing system 910, thereby preventing the second rail component 944b from extending laterally along the X-axis. This may prevent injury to a user.

Further, a spring member 946 is coupled to a support structure 922 and the computing system 910. The spring member 946 may include a gas spring designed to assist a user in providing a rotating force to rotate the computing system 910 to the orientation shown in FIG. 14. Also, the spring member 946 can regulate the rotational velocity when rotating the computing system 910.

Several other features may be integrated, alone or in combination with other features. For example, a friction hinge can couple to a computing system described herein, and can be used to reduce rotational velocity and/or place a computing system at a diagonal (e.g., an angle with respect to the X-axis in the range of 30-60 degrees). The rotational component of a computing system described herein can be motorized, thereby removing the manual requirements for movement.

Figure 15:
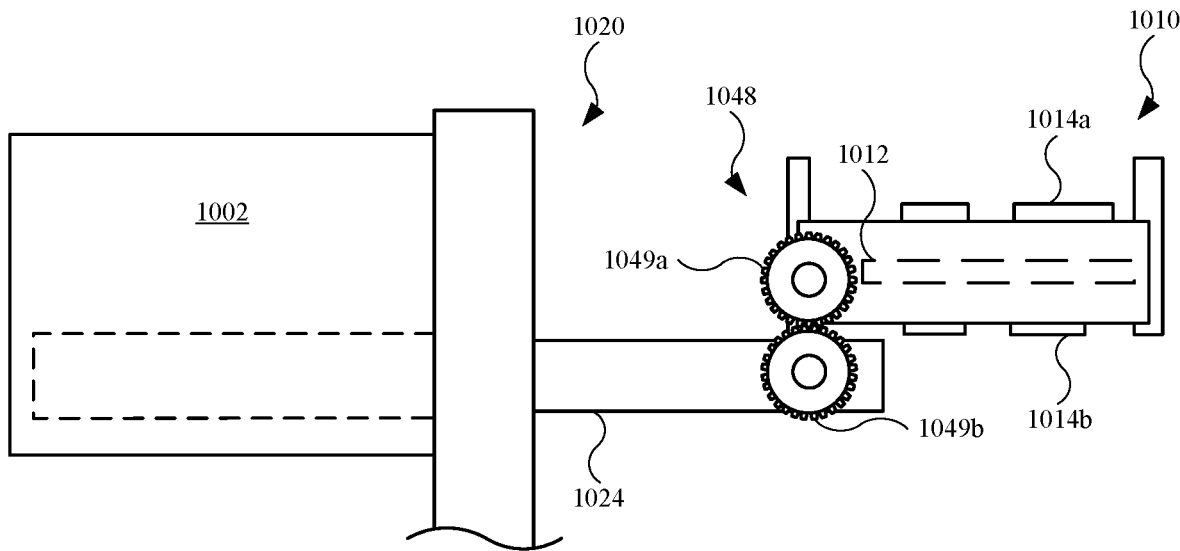
FIG. 15 illustrates a side view of an alternate embodiment a rack system and a computing system, showing a gear system connected to the rack system and the computing system, in accordance with some described embodiments.

FIG. 15 illustrates a side view of an alternate embodiment a computing system 1010 and a rack system 1020, showing a gear system 1048 connected to the rack system 1020 and the computing system 1010, in accordance with some described embodiments. As shown, the rack system 1020 includes a housing 1002 designed to receive the computing system 1010. The computing system 1010 may include a circuit board 1012, as well as component 1014a and a component 1014b mounted to opposing surfaces of the circuit board 1012. Additional components may also be mounted on the circuit board 1012. The rack system 1020 includes a rail 1024 that is coupled to the computing system 1010 by the gear system 1048. The gear system 1048 includes a gear mechanism 1049a coupled to the computing system 1010, and a gear mechanism 1049b coupled to the rail 1024. Based on the position shown in FIG. 15, an operator can readily access the component 1014a.

Figure 16:
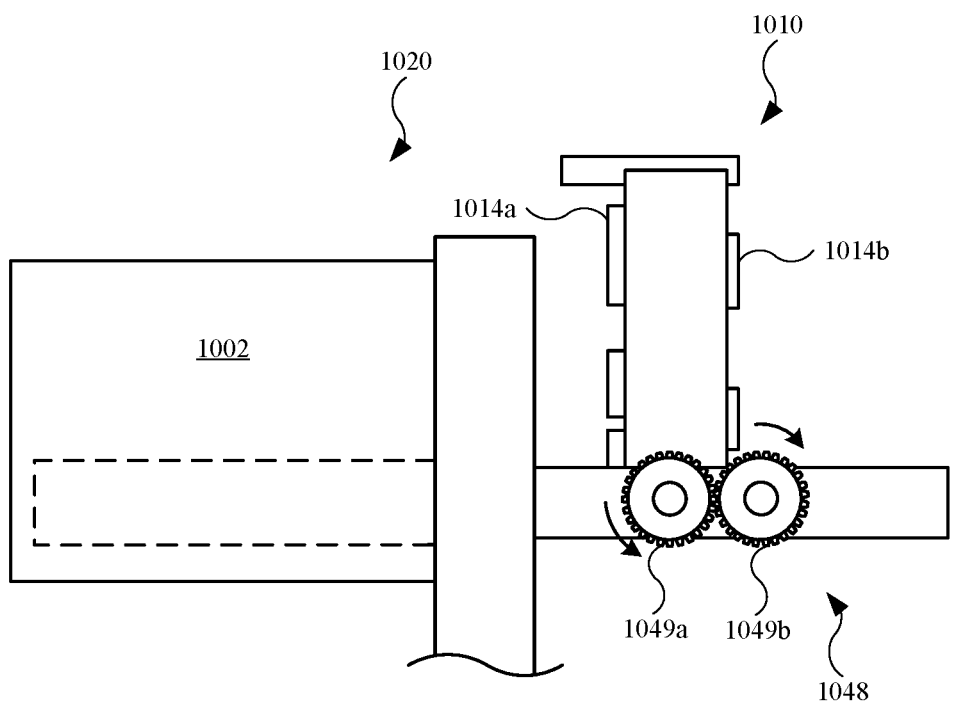
FIG. 16 illustrates a side view of the rack system and the computing system shown in FIG. 15, showing the computing system rotated using the gear system, in accordance with some described embodiments.

However, when access to the component 1014b required, the gear system 1048 can be used. For example, FIG. 16 illustrates a side view of the rack system 1020 and the computing system 1010 shown in FIG. 15, showing the computing system 1010 rotated using the gear system 1048, in accordance with some described embodiments. As shown, the computing system 1010 is rotated approximately 90 degrees such that the component 1014b is readily accessible. In order to rotate the computing system 1010, the gear mechanism 1049b is rotationally driven clockwise, thereby causing counter-clockwise rotation of the gear mechanism 1049a. It should be noted that the gear mechanism 1049b can be subsequently rotated counter-clockwise, thereby causing clockwise rotation of the gear mechanism 1049a, which rotates the computing system 1010 back to its original position (as shown in FIG. 15). The computing system 1010 can then be positioned in the housing 1002.

Figure 17:
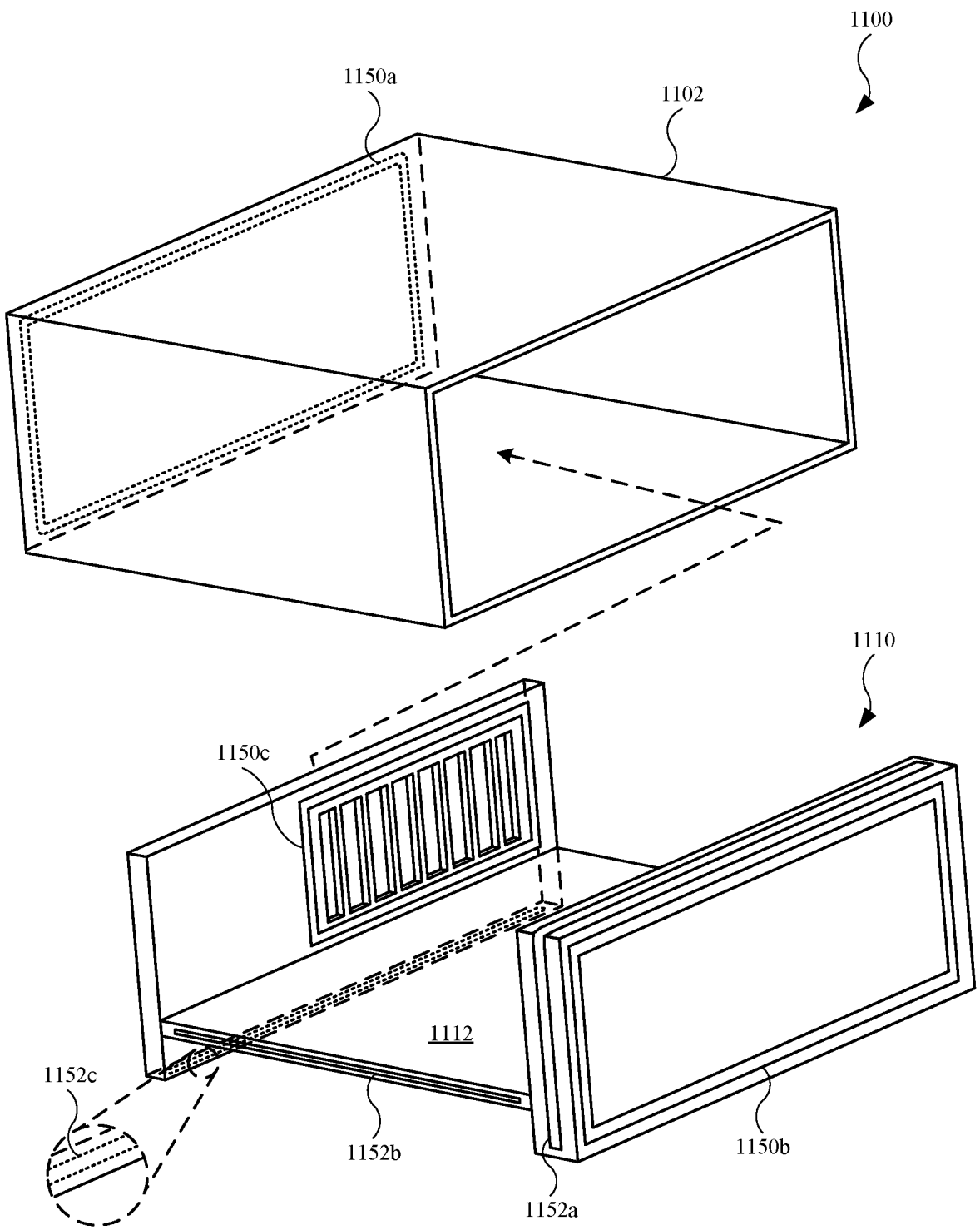
FIG. 17 illustrates an isometric view of an alternate embodiment of a computing assembly, showing several sealing elements disposed throughout a housing and a computing system.

FIG. 17 illustrates an isometric view of an alternate embodiment of a computing assembly 1100, showing several sealing elements disposed throughout a housing 1102 and a computing system 1110, in accordance with some described embodiments. For purposes of illustration, several components are removed from the computing system 1110. The sealing elements may include electromagnetic interference ("EMI") sealing shields designed to prevent intrusion and emission of EMI, or air shields designed to prevent air leaks.

As shown, the housing 1102 may include an EMI shield 1150a within the internal volume (defined by the shape of the housing 1102). It should be noted that the housing 1102, and other housings described herein, may be formed from a metal so as to prevent intrusion and emission of EMI. The computing system 1110 may include an EMI shield 1150b on a front portion such that the computing assembly 1100 includes EMI shield at opposing ends (with the EMI shield 1150a at one end and the EMI shield 1150b at the other end). The computing system 1110 may include an EMI shield 1150c positioned around several openings (not labeled) in a location of expansion slots on a circuit board 1112.

The computing system 1110 may include an air shield 1152a on the front portion. The computing system 1110 may include an air shield 1152b on the circuit board 1112. The computing system 1110 may include an air shield 1152c on a back portion. At least some of these air shields are resistant to wear by, for example, rubbing against the air shields in two different directions. This may occur when the computing system 1110 is slid, in one direction, into and out of the housing 102 of a standalone workstation (shown in FIG. 1), or slid in another perpendicular direction, when inserted into the housing 202 in a rack system 220 (shown in FIG. 4).

The foregoing embodiments show and described computing assemblies in which the computing system is separable from the housing. In other words, the computing system could be removed from the housing in order to initiate servicing of the computing system or to transition the computing system from a standalone workstation to a rack environment, as non-limiting examples. However, in some embodiments, the computing system is secured or fastened to the housing, and the housing is modified to allow access to internal components of the computing system.

Figure 18:
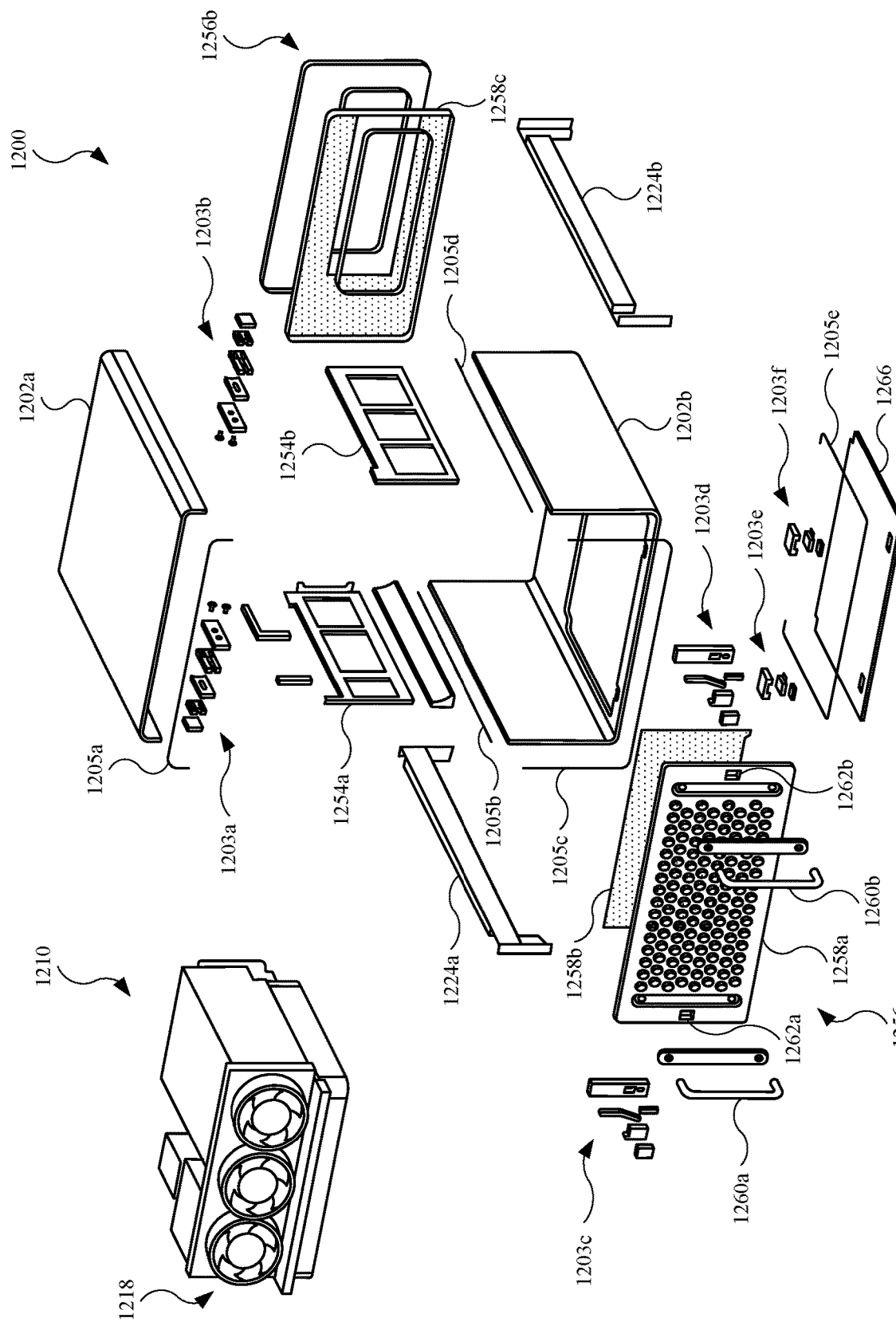
FIG. 18 illustrates an exploded view of an alternate embodiment of a computing assembly.

FIG. 18 illustrates an exploded view of an alternate embodiment of a computing assembly 1200. As shown, the computing assembly 1200 includes housing component 1202a and a housing component 1202b. The housing component 1202a can combine with the housing component 1202b, and form a housing for a computing system 1210. The computing system 1210 may include several features and components shown and described herein for a computing system, including a fan assembly 1218. In order to secure the housing component 1202a with the housing component 1202b, the computing assembly 1200 may include a latch assembly 1203a and a latch assembly 1203b.

The computing assembly 1200 can be connected to a rail 1224a and a rail 1224b. The rail 1224a and the rail 1224b can couple to the housing component 1202b as well as a rack system (not shown in FIG. 18). In this manner, both the housing component 1202a and the housing component 1202b (along with the computing assembly 1200) can move relative to the rack system.

In order to secure the computing assembly 1200 to the housing component 1202b, the computing assembly 1200 may further include a bracket 1254a and a bracket 1254b. The housing component 1202b may include modifications used to receive and align the bracket 1254a and the bracket 1254b. This will be further shown and described below.

The computing assembly 1200 may further include a plate assembly 1256a and a plate assembly 1256b designed to secure with the housing component 1202a and the housing component 1202b. The plate assembly 1256a and the plate assembly 1256b may be referred to as a front plate assembly and a back plate assembly, respectively.

As shown, the plate assembly 1256a includes a plate 1258a and a plate 1258b. Both the plate 1258a and the plate 1258b include several openings. The plate 1258a includes relatively larger openings, as compared to the openings of the plate 1258b, in order to allow airflow taken in by the fan assembly 1218. The relatively smaller openings of the plate 1258b may limit debris from entering the computing system 1210. In order to insert the computing assembly 1200 into a rack system or to remove the computing assembly 1200 from the rack system, the plate assembly 1256a includes a handle 1260a and a handle 1260b.

Further, the plate assembly 1256a may include a latch assembly 1203c and a latch assembly 1203d. Each latch assembly may include a lever (not labeled), with the lever of the latch assembly 1203c and the latch assembly 1203d positioned in an opening 1262a and an opening 1262b, respectively, of the plates 1258. The latch assembly 1203c and the latch assembly 1203d are designed to regulate the position of the computing assembly 1200 in a rack system. For example, the latch assembly 1203c and the latch assembly 1203d can maintain the computing assembly 1200 within the rack system. Conversely, when the computing assembly 1200 is out of the rack system, the latch assembly 1203c and the latch assembly 1203d can lock out the computing assembly 1200, thereby preventing the computing assembly 1200 from moving back into the rack system. This will be further discussed below.

The plate assembly 1256b may include a plate 1258c that includes an opening that allows access to expansion slots (not shown in FIG. 18), as an example, integrated with the computing system 1210. In some instances, the plate assembly 1256a and/or the plate assembly 1256b are removed to allow access to the computing system 1210. However, the computing assembly 1200 includes additional access points. For example, the computing assembly 1200 may include a hatch 1266 coupled to the housing component 1202b. The hatch 1266 can be removed when access to at least some of the operational components of the computing system 1210 is desired. The hatch 1266 can be removed from the housing component 1202b using a latch assembly 1203e and a latch assembly 1203f.

The computing assembly 1200 may further include several sealing elements designed to limit or prevent air into the computing assembly 1200. For example, the computing assembly 1200 includes a sealing element 1205a, a sealing element 1205b, a sealing element 1205c, and a sealing element 1205d. These sealing elements can act as gaskets and provide air seals between the housing component 1202a and the housing component 1202b. The computing assembly 1200 further includes a sealing element 1205e that provides an air seal between the housing component 1202b and the hatch 1266.

Figure 19:
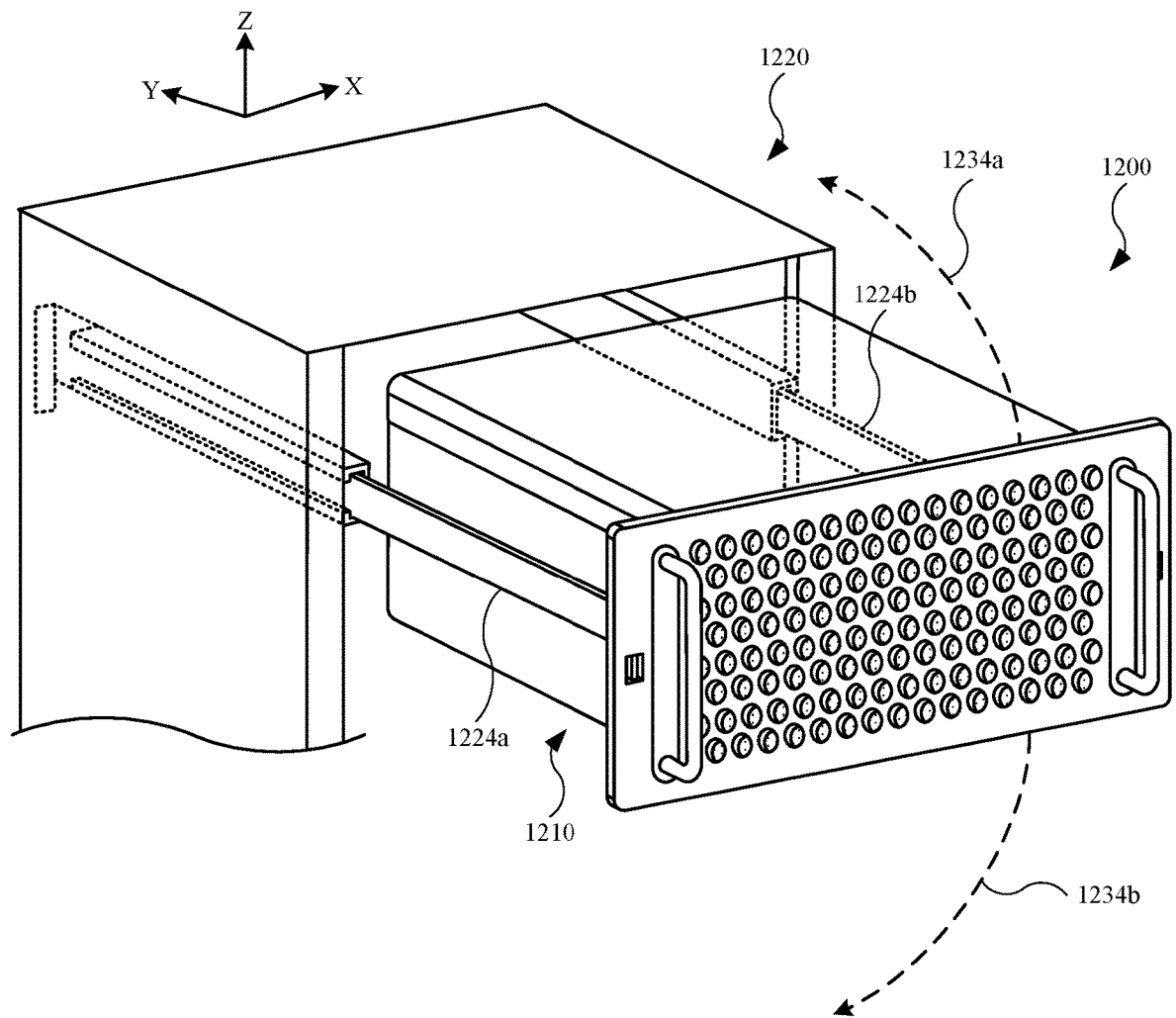
FIG. 19 illustrates an isometric view of the computing assembly shown in FIG. 18, showing the computing assembly integrated with a rack system.

FIG. 19 illustrates an isometric view of the computing assembly 1200 shown in FIG. 18, showing the computing assembly 1200 integrated with a rack system 1220. The rail 1224a and the rail 1224b permit relative movement of the computing assembly 1200 with respect the rack system 1220 such that the computing assembly 1200 is external to the rack system 1220, representing an open position of the computing assembly 1200. Also, the open position may also refer to a position in which the computing assembly 1200 is not positioned within the rack system 1220.

When the computing assembly 1200 is in the open position, at least some the components of the computing system 1210 is accessible. For example, the hatch 1266 (shown in FIG. 18) can be opened and provide access to the computing system 1210. Although not shown, the rail 1224a and the rail 1224*b* can be modified to allow the computing assembly 1200 to rotate (similar to prior embodiments) in a direction of the arrow 1234*a* or the arrow 1234*b*, thereby facilitating access to the computing system 1210 when the hatch 1266 is removed. Based on the open position, the computing system 1210 is unobstructed from the rack system 1220.

Figure 20:
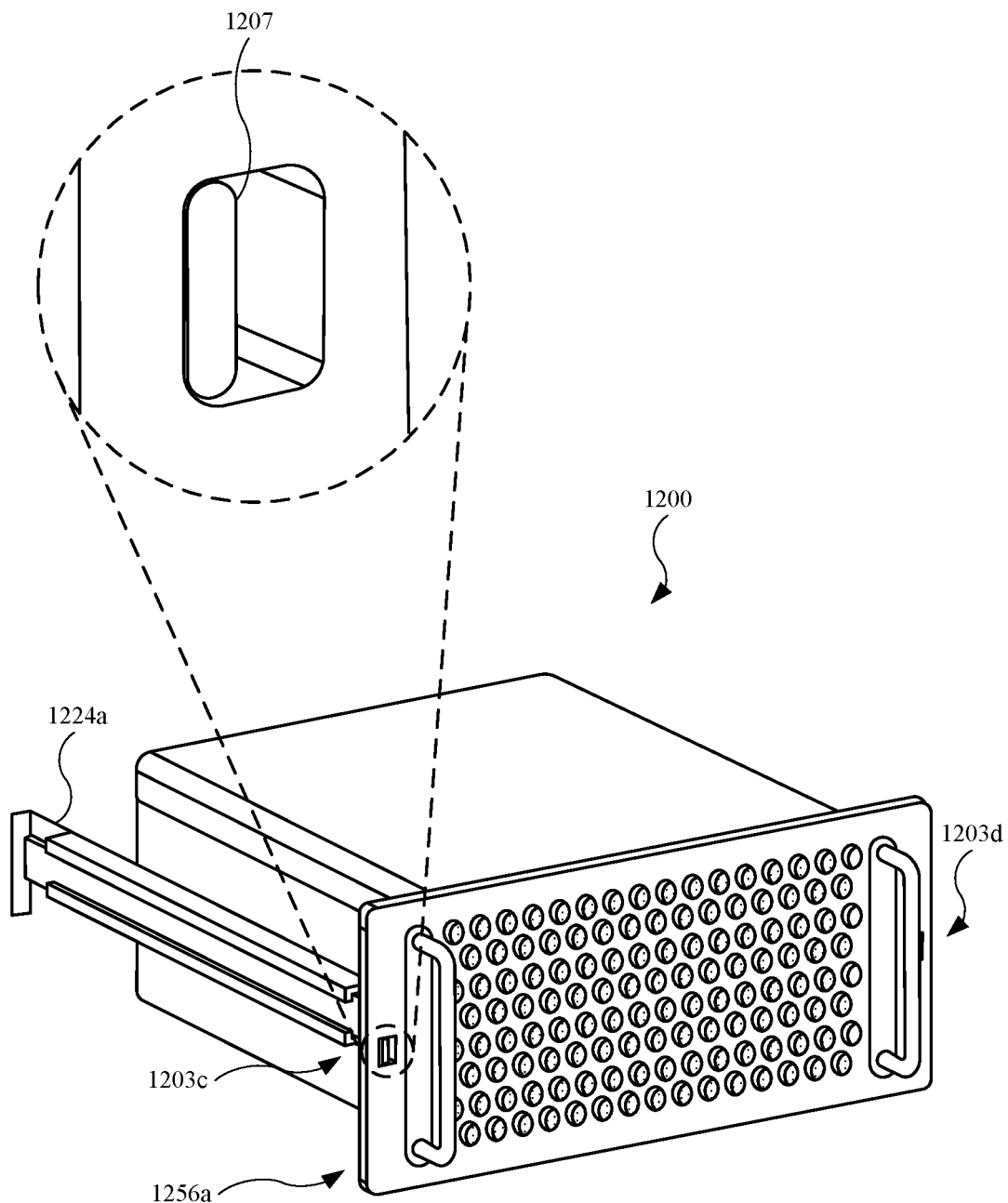
FIG. 20 illustrates a front isometric view of the computing assembly, showing the latch assembly of the plate assembly.

FIG. 20 illustrates a front isometric view of the computing assembly 1200, showing the latch assembly 1203*c* and the plate assembly 1256*a*. As shown in the enlarged view, the latch assembly 1203*c* includes a slide mechanism 1207 that can be operated by a user. The slide mechanism 1207 can place the latch assembly 1203*c* in a locked or unlocked configuration. The locked configuration corresponds to the computing assembly 1200 being immobilized within the rack unit (not shown in FIG. 20) or out of the rack unit when the computing assembly 1200 lies outside the rack unit, based upon the position of the computing assembly 1200 when the latch assembly 1203*c* is moved to the locked configuration. Regarding the latter, when the computing assembly 1200 is outside of the rack unit and the latch assembly 1203*c* is in the locked configuration, the computing assembly 1200 is locked out and prevented from returning to within the rack unit. The unlocked configuration corresponds to the computing assembly 1200 movable in conjunction with the rail 1224*a* and the rail 1224*b* (shown in FIG. 18) to an open or closed position. Although not shown, the latch assembly 1203*d* also includes a slide mechanism similar to the slide mechanism 1207. As a result, both slide mechanisms may require user operation to place the computing assembly 1200 in the locked or unlocked configuration.

Figure 21:
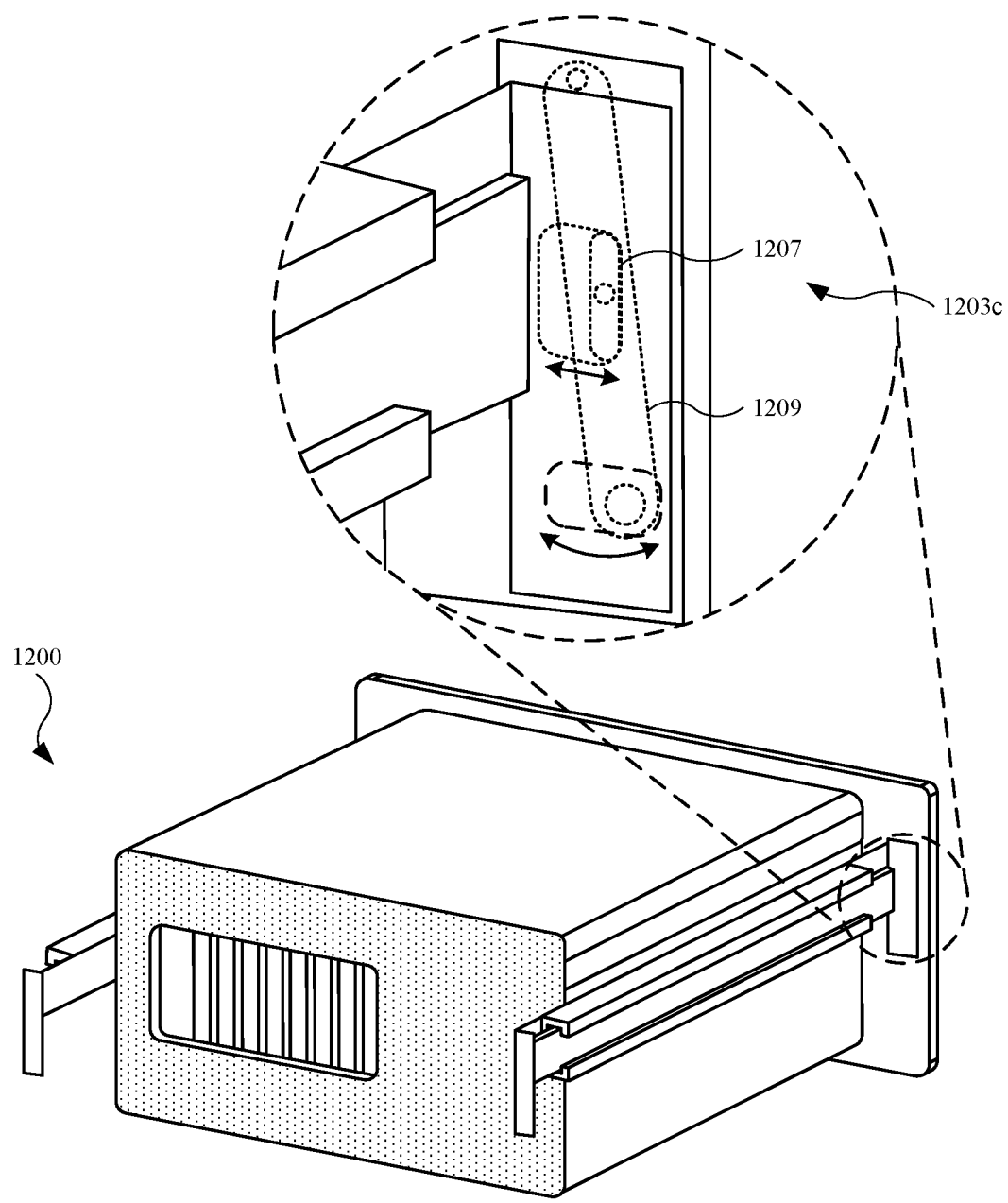
FIG. 21 illustrates a rear isometric view of the computing assembly, further showing the latch assembly.

FIG. 21 illustrates a rear isometric view of the computing assembly 1200, further showing the latch assembly 1203*c*. As shown in the enlarged view, the latch assembly 1203*c* includes a lever 1209 attached to the slide mechanism 1207. In this regard, user actuation of the slide mechanism 1207 corresponds to actuation of the lever 1209. Further, the user actuation of the slide mechanism 1207 and the lever 1209 places the latch assembly 1203*c* in the locked or unlocked configuration.

Figure 22:
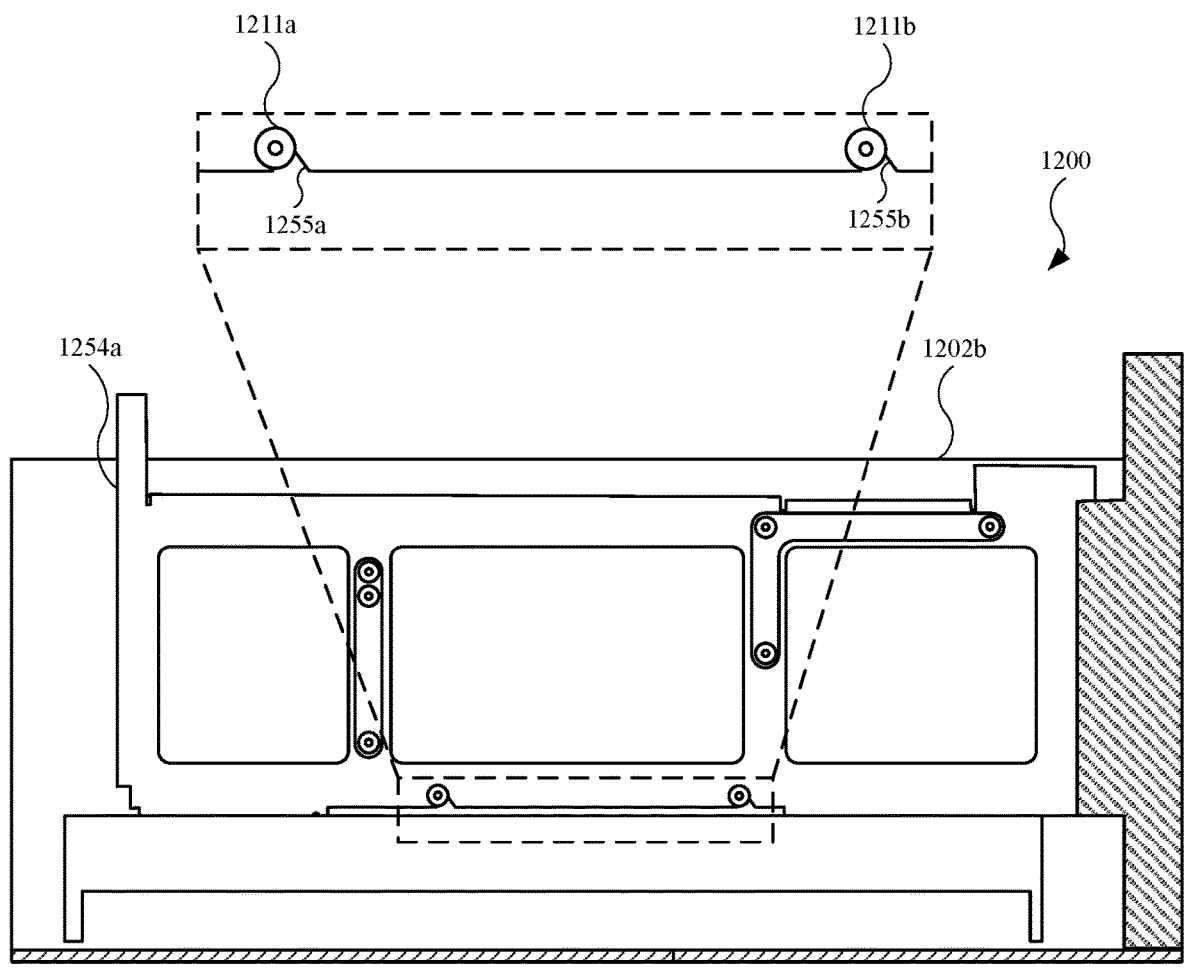
FIG. 22 illustrates a side view of the bracket installed in the housing component.

FIG. 22 illustrates a side view of the bracket 1254*a* installed in the housing component 1202*b*. A partial cross section of the housing component 1202*b* is shown. The bracket 1254*a* and the bracket 1254*b* (shown in FIG. 18) are designed to secure the computing system 1210 (shown in FIG. 18) with the housing component 1202*b*. As shown in the enlarged view, the housing component 1202*a* may include a pin 1211*a* and a pin 1211*b*. The bracket 1254*a* includes a recess 1255*a* and a recess 1255*b* engaged with the pin 1211*a* and the pin 1211*b*, respectively. The recess 1255*a* and the recess 1255*b* each include a diagonal recess. In this regard, the recess 1255*a* and the recess 1255*b* engage the pin 1211*a* and the pin 1211*b*, respectively, and move diagonally with respect to the housing component 1202*b*. Further, the diagonal design of the recess 1255*a* and the recess 1255*b* assist in leading and centering the bracket 1254*a*, and particularly the computing system 1210 (not shown in FIG. 18), within the housing component 1202*b*. Also, the computing system 1210, when positioned within the housing component 1202*b*, may compress the sealing element 1205*b* and the sealing element 1205*d* (both shown in FIG. 18).

Figure 23:
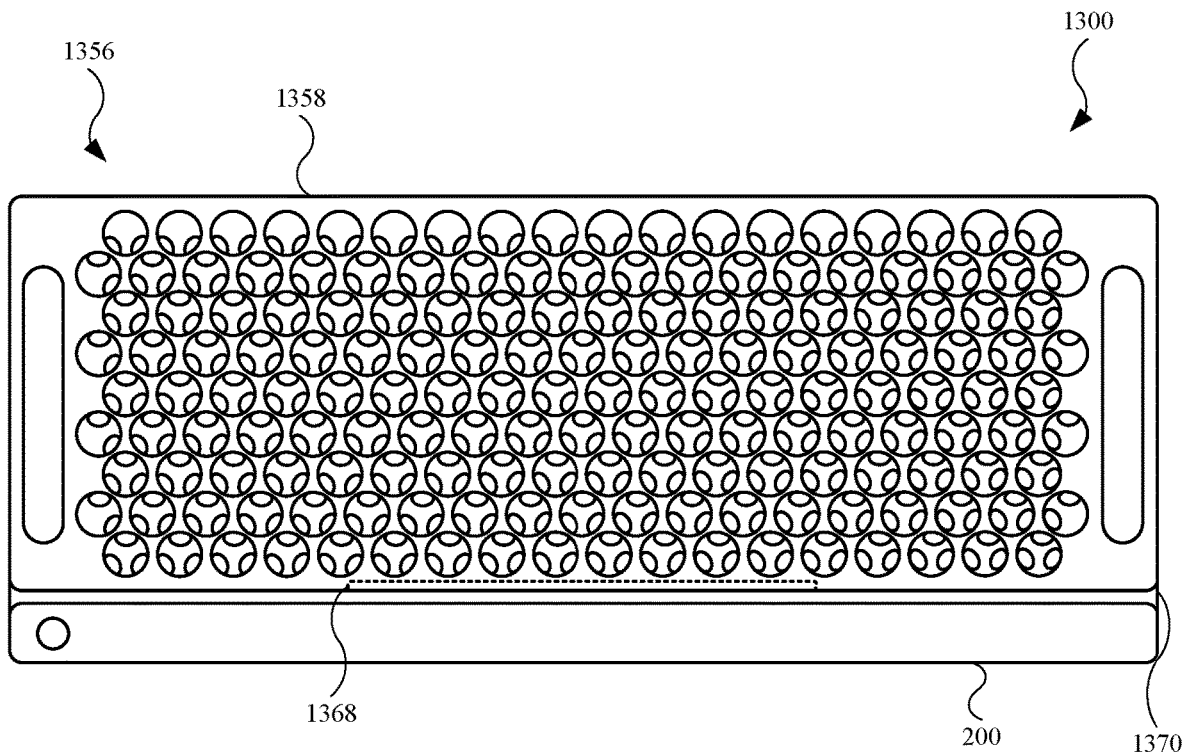
FIG. 23 illustrates a front view of an embodiment of a computing assembly, showing the computing assembly with a plate assembly and an antenna integrated with the plate assembly.

FIG. 23 illustrates a front view of an embodiment of a computing assembly 1300, showing the computing assembly 1300 with a plate assembly 1356 and an antenna 1368 integrated with the plate assembly 1356. The plate assembly 1356 may include several features described herein for a plate assembly. The antenna 1368 (shown as a dotted line) is positioned along an edge of a plate 1358. Moreover, the antenna 1368 is positioned along a recess 1370 formed in the plate 1358. As a result, the antenna 1368 is capable of transmission and receipt of radio frequency ("RF") transmission even when the plate 1358 is formed from a metal generally known to block RF transmission.

Figure 24:
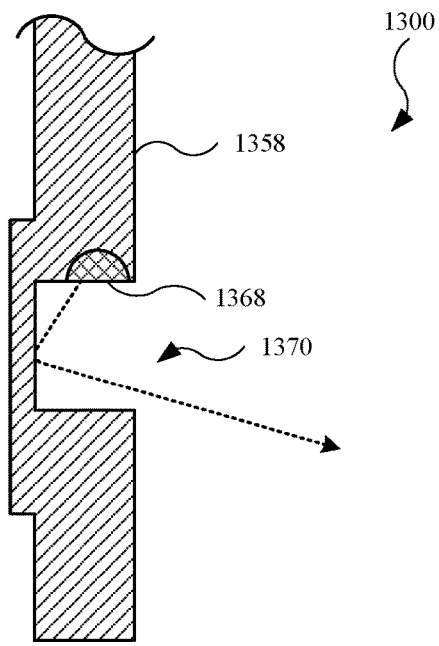
FIG. 24 illustrates a cross sectional view of the computing assembly shown in FIG. 23, showing the antenna providing RF transmission.

FIG. 24 illustrates a cross sectional view of the computing assembly 1300 shown in FIG. 23, showing the antenna 1368 providing RF transmission. As shown, the antenna 1368 is integrated with the plate 1358 such that the antenna 1368 is at least partially uncovered by the plate 1358 and opens to the recess 1370. Further, during RF transmission (represented by a dotted line) by the antenna 1368, the antenna 1368 is oriented such that RF transmission generated by the antenna 1368 can reflect off of the plate 1358 and pass through the recess 1370. Conversely, the antenna 1368 may receive RF transmission that is first reflected off of the plate 1358. As a result of the integration of the antenna 1368 on an external structural such as the plate 1358, the computing assembly 1300 may require less internal design changes as the antenna 1368 does not need to be accounted for within a computing system.

Figure 25:
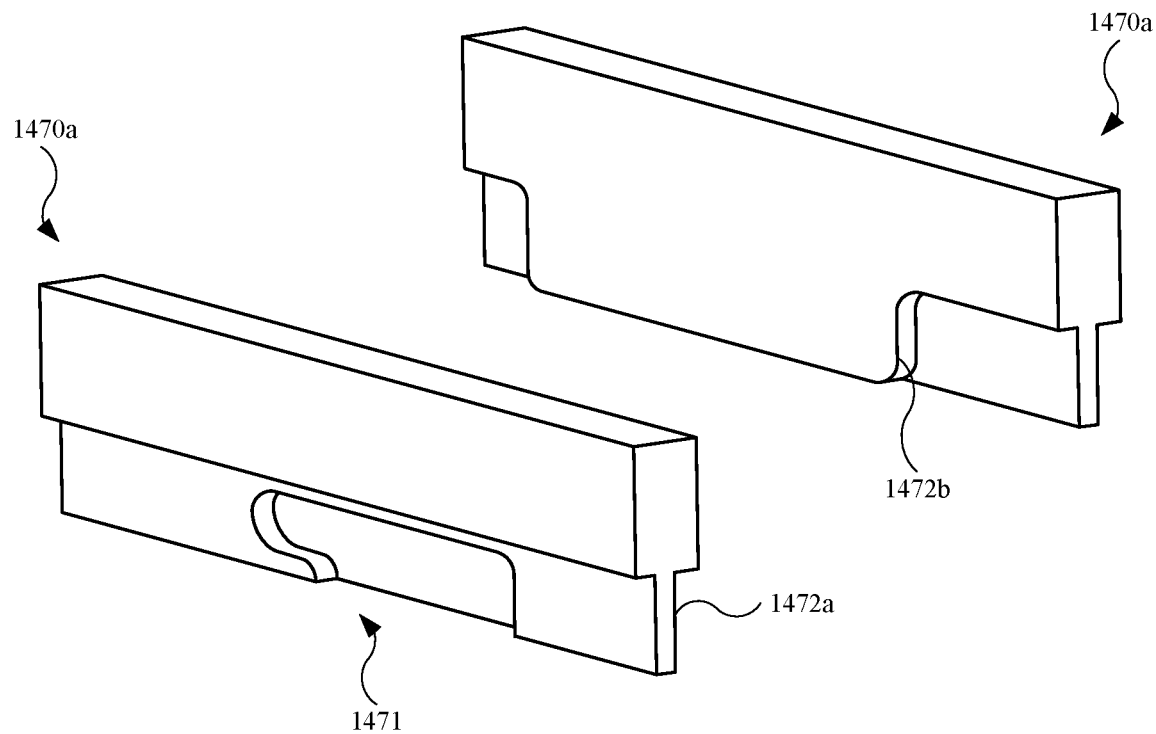
FIG. 25 illustrates isometric views of an embodiment of a coupling mechanism.
Figure 26:
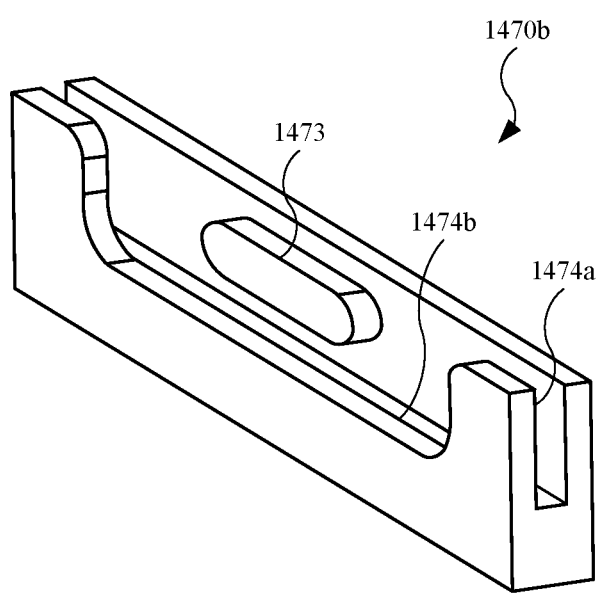
FIG. 26 illustrates an isometric view of an embodiment an coupling mechanism.

FIGS. 25 and 26 show and described additional structural elements used to couple together housing components of a computing assembly described herein. The described structural elements can be integrated with the housing components for a computing assembly. FIG. 25 illustrates isometric views of an embodiment of a coupling mechanism 1470*a*. As shown, the coupling mechanism 1470*a* includes a recess 1471 and a protrusion 1472*a*. In the additional view (showing an opposing side), the coupling mechanism 1470*a* includes a protrusion 1472*b*.

FIG. 26 illustrates an isometric view of an embodiment an additional coupling mechanism. As shown, the coupling mechanism 1470*b* includes a protrusion 1473, as well as a recess 1474*a* and a recess 1474*b*. The coupling mechanism 1470*a* (shown in FIG. 25) is designed to couple/mate with the coupling mechanism 1470*b*. In this regard, the protrusion 1472*a* of the coupling mechanism 1470*b* can fit into the recess 1474*a* of the coupling mechanism 1470*b*, and the protrusion 1472*b* of the coupling mechanism 1470*b* can fit into the recess 1474*b* of the coupling mechanism 1470*b*. Then, the coupling mechanism 1470*a* can slide relative to the coupling mechanism 1470*b*, or vice versa, such that the protrusion 1473 slides (or at least partially slides) into the recess 1471. The coupling mechanism 1470*a* can de-couple from the coupling mechanism 1470*b* by sliding the coupling mechanism 1470*a* in the opposite direction.

Figure 27:
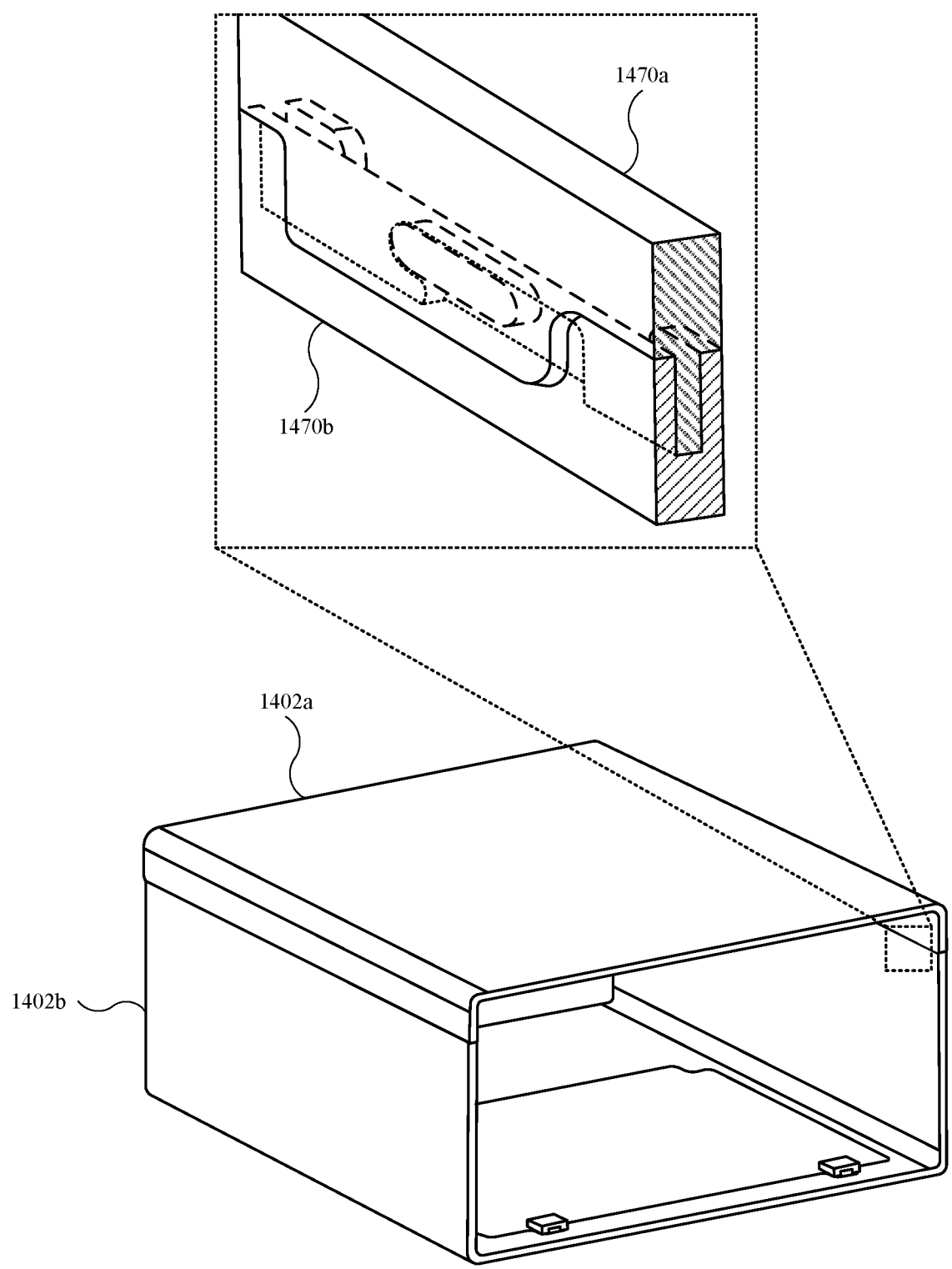
FIG. 27 illustrates an isometric view of an embodiment of housing components for a computing assembly, showing the housing components secured together by coupling mechanisms.

FIG. 27 illustrates an isometric view of an embodiment of housing components for a computing assembly, showing the housing components secured together by coupling mechanisms. As shown, a housing component 1402*a* is coupled with a housing component 1402*b*. As shown in the enlarged view, the coupling mechanism 1470*a* (integrated with the housing component 1402*a*) is coupled, or interlocked, with the coupling mechanism 1470*b* (integrated with the housing component 1402*b*) in a manner previously described. When the coupling mechanism 1470*a* and the coupling mechanism 1470*b* are coupled together, the outer surfaces of the housing component 1402*a* are flush, or co-planar, with respective outer surfaces of the housing component 1402*b*. Accordingly, coupling mechanism 1470*a* and the coupling mechanism 1470*b* can reduce or eliminate offset surface between the housing component 1402*a* and the housing component 1402*b*, and provide an appearance of a seamless housing. It should be noted that the housing component 1402*a* and the housing component 1402*b* may include additional coupling mechanisms similar to the coupling mechanism 1470*a* and the coupling mechanism 1470*b*, respectively.

Figure 28:
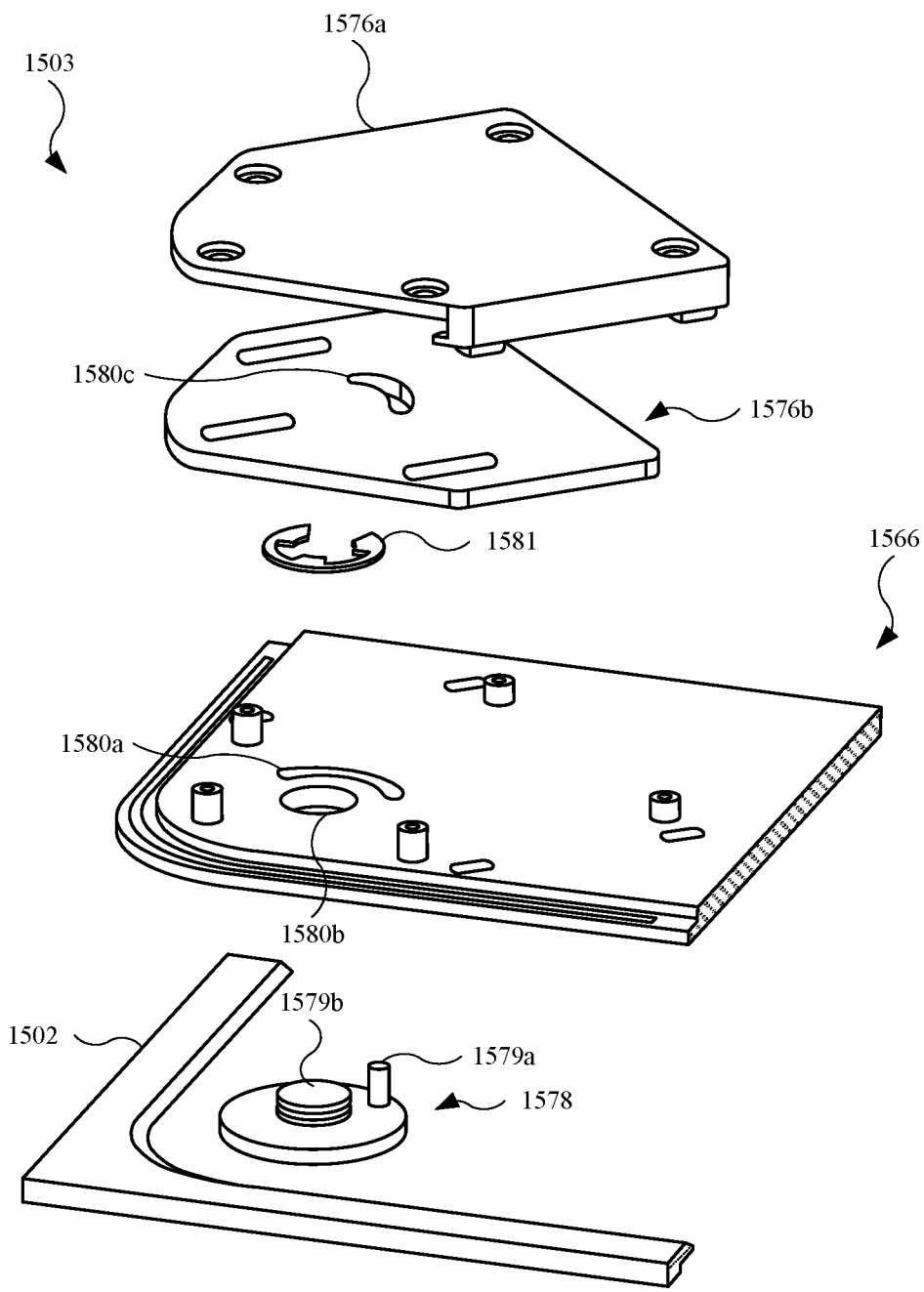
FIG. 28 illustrates an isometric view of an embodiment of latch assembly used to secure a housing component with a hatch.

FIG. 28 illustrates an isometric view of an embodiment of latch assembly 1503 used to secure a housing component 1502 with a hatch 1566. The housing component 1202*b* and the hatch 1266 (shown in FIG. 28) may be modified with features shown in FIG. 28. As shown, the latch assembly 1503 includes a bracket 1576*a* and a bracket 1576*b* designed to slide into the bracket 1576*a*. The latch assembly 1503 further includes a key mechanism 1578. The key mechanism 1578 includes a protrusion 1579*a* and a protrusion 1579*b* that passes through an opening 1580*a* and an opening 1580*b*, respectively, of the hatch 1566. The latch assembly 1503 further includes a washer 1581 that engages the protrusion 1579*b*. In addition, the protrusion 1579*a* passes through an opening 1580*c* of the bracket 1576*b* such that the protrusion 1579*a* can engage the bracket 1576*a*. As a result, the key mechanism 1578 can be actuated (i.e., rotated) to actuate the bracket 1576*a*. Although the key mechanism 1578 is rotated, the protrusion 1579*a* may follow a straight, or linear, path to promote movement of the bracket 1576*a*.

Figure 29:
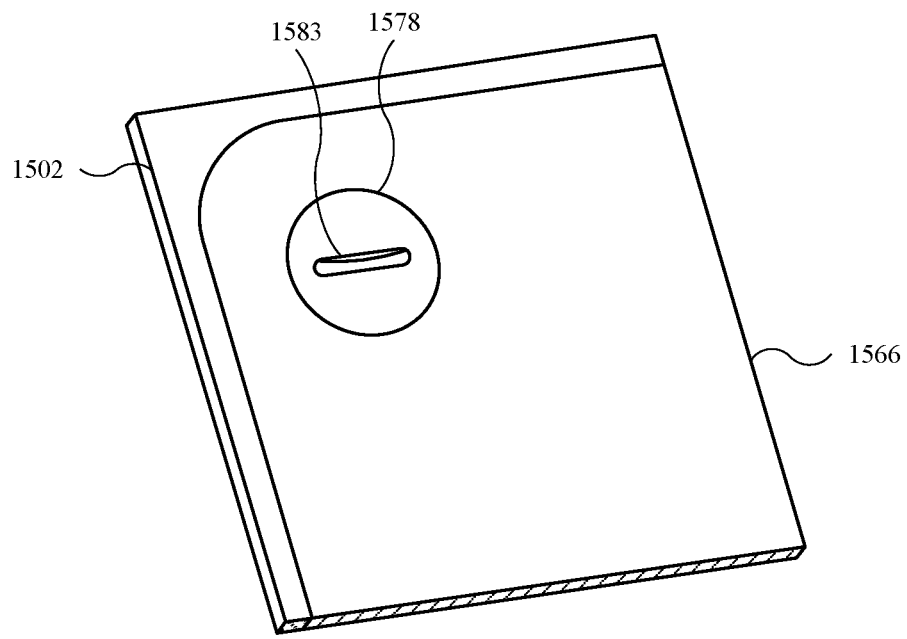
FIG. 29 illustrates a partial isometric view of the hatch secured with the housing component.

FIG. 29 illustrates a partial isometric view of the hatch 1566 secured with the housing component 1502. The view shown in FIG. 29 represents an external view of the housing component 1502 and the hatch 1566. The key mechanism 1578 includes a slot 1583 that can receive a tool (not shown in FIG. 29) used to rotate the key mechanism 1578.

Figure 30:
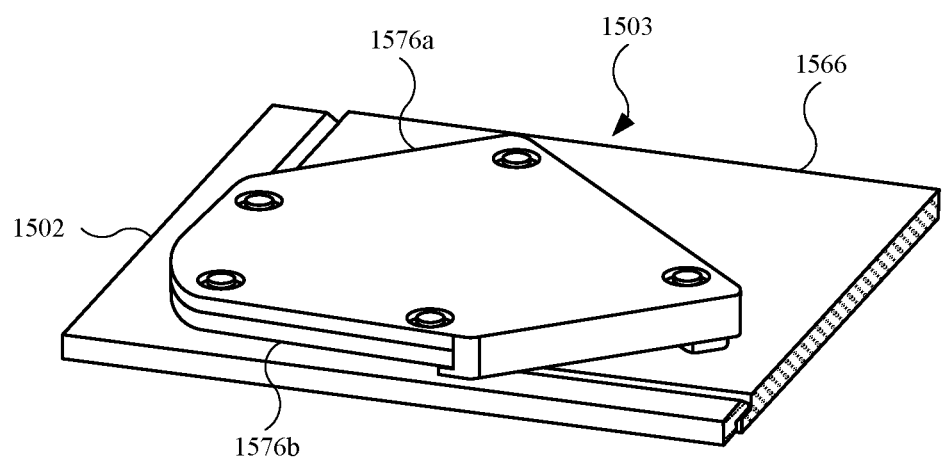
FIG. 30 illustrates a partial isometric view of the hatch secured with the housing component based on the latch assembly, showing the latch assembly in a locked configuration.

FIG. 30 illustrates a partial isometric view of the hatch 1566 secured with the housing component 1502 based on the latch assembly 1503, showing the latch assembly 1503 in a locked configuration. The view shown in FIG. 30 represents an internal view of the housing component 1502 and the hatch 1566. As shown, in the locked configuration, the bracket 1576*a* fully covers a surface of the bracket 1576*b*, and the hatch 1566 remains engaged with the housing component 1502. Accordingly, the locked configuration corresponds to a locked configuration of the hatch 1566 with respect to the housing component 1502.

Figure 31:
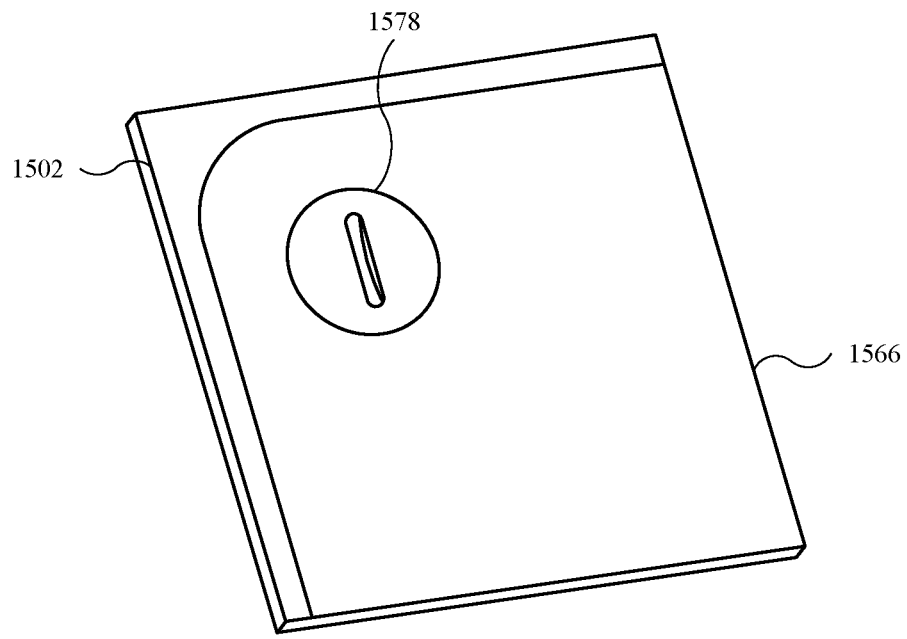
FIG. 31 illustrates a partial isometric view of the hatch and the housing component shown in FIG. 29, showing the key mechanism rotated.

FIG. 31 illustrates a partial isometric view of the hatch 1566 and the housing component 1502 shown in FIG. 29, showing the key mechanism 1578 rotated. As shown, the key mechanism 1578 is rotated approximately 90 degrees.

Figure 32:
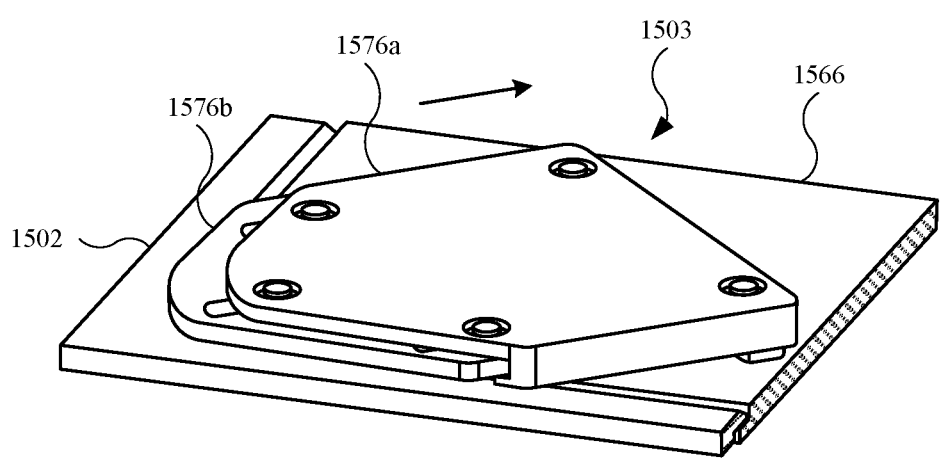
FIG. 32 illustrates a partial isometric view of the hatch and the housing component, showing the latch assembly in an unlocked configuration.

FIG. 32 illustrates a partial isometric view of the hatch 1566 and the housing component 1502, showing the latch assembly 1503 in an unlocked configuration. As shown, in the unlocked configuration, the bracket 1576*a* moves relative to the bracket 1576*b* and the surface of the bracket 1576*b* is partially exposed. Based on the movement of the bracket 1576*a*, the hatch 1566 can be removed from the housing component 1502. Accordingly, the unlocked configuration corresponds to an unlocked configuration of the hatch 1566 with respect to the housing component 1502. It should be noted that the key mechanism 1578 can be modified to rotate to an angle other than 90 degrees to place the latch assembly 1503 in the unlocked configuration.

Figure 33:
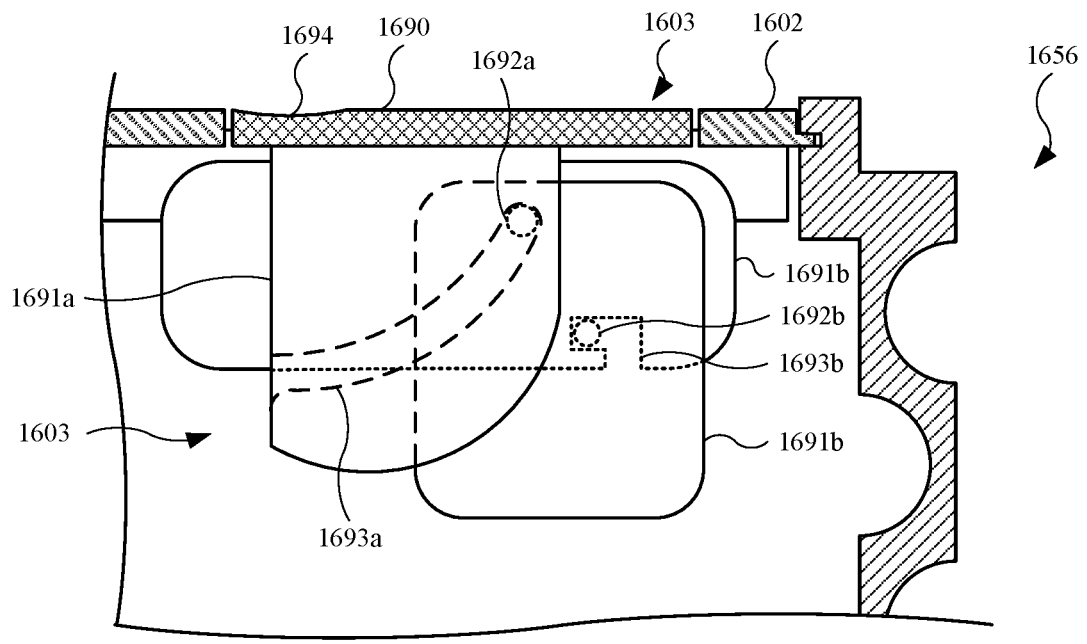
FIG. 33 illustrates a cross sectional view of an embodiment of a housing component and a plate assembly, further showing a latch assembly integrated with the housing component.

FIG. 33 illustrates a cross sectional view of an embodiment of a housing component 1602 and a plate assembly 1656, further showing a latch assembly 1603 integrated with the housing component 1602. The housing component 1602 may represent a housing component similar to the housing component 1202*a* (shown in FIG. 18) or the hatch 1266 (shown in FIG. 18). As shown, the latch assembly 1603 includes a lever 1690 and a latch mechanism 1691*a* connected to the lever 1690. The latch assembly 1603 further includes a latch mechanism 1691*b*. The latch assembly 1603 includes a pin 1692*a* that extends from the latch mechanism 1691*b* and into a guide 1693*a* formed in the latch mechanism 1691*a*. The housing component 1602 includes a pin 1692*b* that extends from an internal wall and into a guide 1693*b* formed in the latch mechanism 1691*b*. The latch assembly 1603 is designed to lock the housing component 1602 with the plate assembly 1656. However, when an applied force is provided to a button 1694 (defined by a recess) of the lever 1690, the latch assembly 1603 can disengage the housing component 1602 from the plate assembly 1656.

Figure 34:
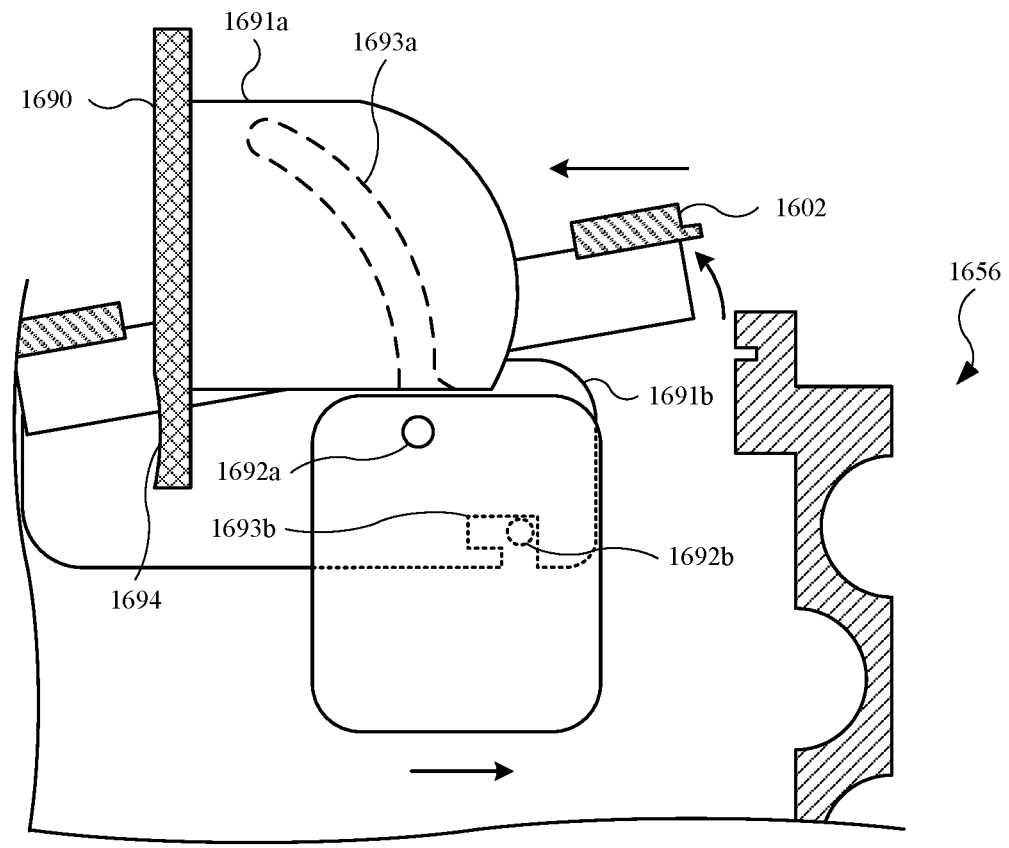
FIG. 34 illustrates a cross sectional of the housing component disengaged from the plate assembly using the latch assembly.

FIG. 34 illustrates a cross sectional of the housing component 1602 disengaged from the plate assembly 1656 using the latch assembly 1603. When an applied force to the button 1694 causes the lever 1690 and the latch mechanism 1691*a* to rotate. During rotation, the latch mechanism 1691*a* engages the pin 1692*a* along the guide 1693*a*. The combination of the movement of the latch mechanism 1691*a* and the engagement between the latch mechanism 1691*a* and the pin 1692*a* causes latch mechanism 1691*b* to move laterally relative to the pin 1692*b*. The relative movement places the pin 1692*b* in a location within the guide 1693*b* that allows the housing component 1602 to disengage from the pin 1692*b* and move away from the plate assembly 1656. As a result, the housing component 1602 can be pulled away from the plate assembly 1656 such that the housing component 1602 can be removed.

Figure 35A:
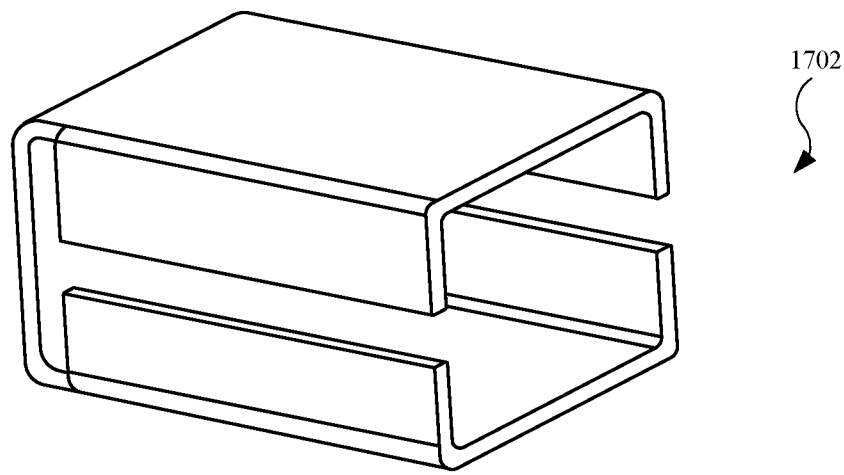
FIGS. 35A-35C illustrate isometric views of alternate embodiments of a housing.
Figure 35B:
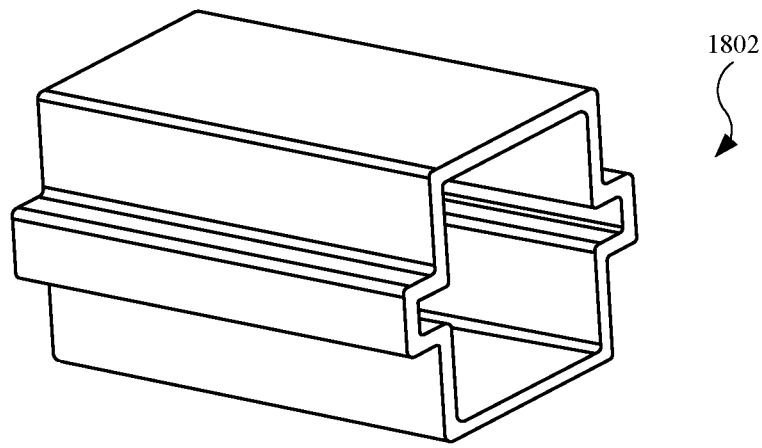
Figure 35C:
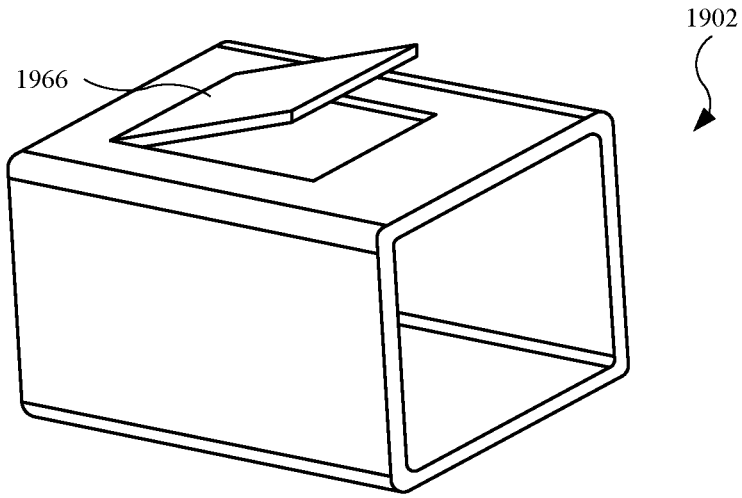

FIGS. 35A-35C illustrate isometric views of alternate embodiments of a housing. The housings shown and described in FIGS. 35A-35C can substitute for other housings shown herein. FIG. 35A shows a housing 1702 that includes openings that can be used as multiple access points to a computing system, or alternatively for rails (not shown in FIG. 35A) such that the housing can be integrated with a rack unit. FIG. 35B shows a housing 1802 that includes multiple extensions for accommodating rails (not shown in FIG. 35B). FIG. 35C shows a housing 1902 that includes a single piece housing with a hatch 1966 that allows user access to a computing system (not shown in FIG. 35C) located in the housing 1902.

Figure 36:
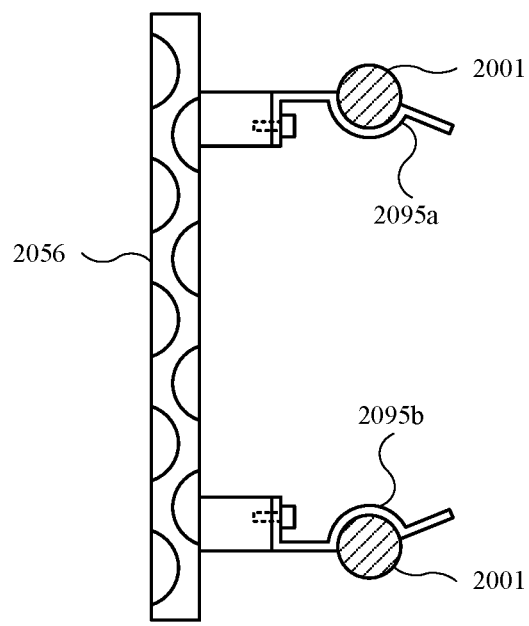
FIG. 36 illustrates a partial cross sectional view of a plate assembly secured with a handle, in accordance with some described embodiments.

FIG. 36 illustrates a partial cross sectional view of a plate assembly 2056 secured with a handle 2001, in accordance with some described embodiments. The handle 2001 may be similar to the handle 101*a* and/or the handle 101*b* (shown in FIG. 2). As shown, the handle 2001 is secured with the plate assembly 2056 by a snap mechanism 2095*a* and a snap mechanism 2095*b*. The snap mechanism 2095*a* and the snap mechanism 2095*b* can clip onto the handle 2001, and can subsequently be pulled off of the handle 2001 to remove the plate assembly 2056 from the handle 2001.

Figure 37:
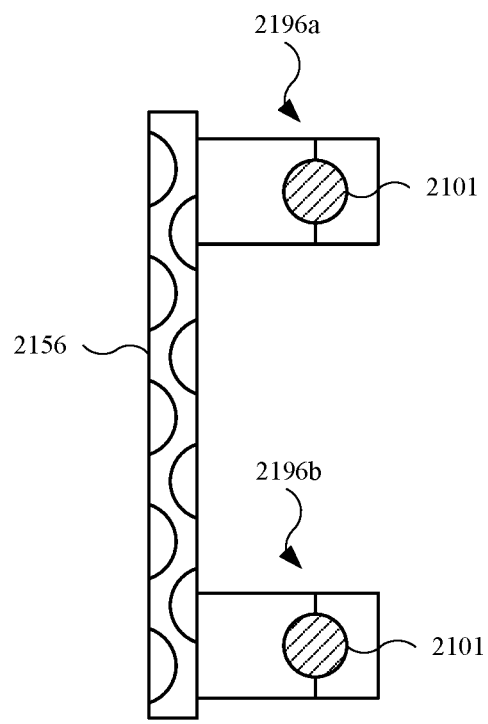
FIG. 37 illustrates a partial cross sectional view of an alternate embodiment of a plate assembly secured with a handle.

FIG. 37 illustrates a partial cross sectional view of an alternate embodiment of a plate assembly 2156 secured with a handle 2101. The handle 2101 may be similar to the handle 101*a* and/or the handle 101*b* (shown in FIG. 2). As shown, the handle 2101 is secured with the plate assembly 2156 by a clamp mechanism 2196*a* and a clamp mechanism 2196*b*. The clamp mechanism 2196*a* and the clamp mechanism 2196*b* can cover an outer circumference of the handle 2101, and can subsequently be removed from the handle 2101 by removing a portion of the clamp mechanism 2196*a* and the clamp mechanism 2196*b*.

Figure 38:
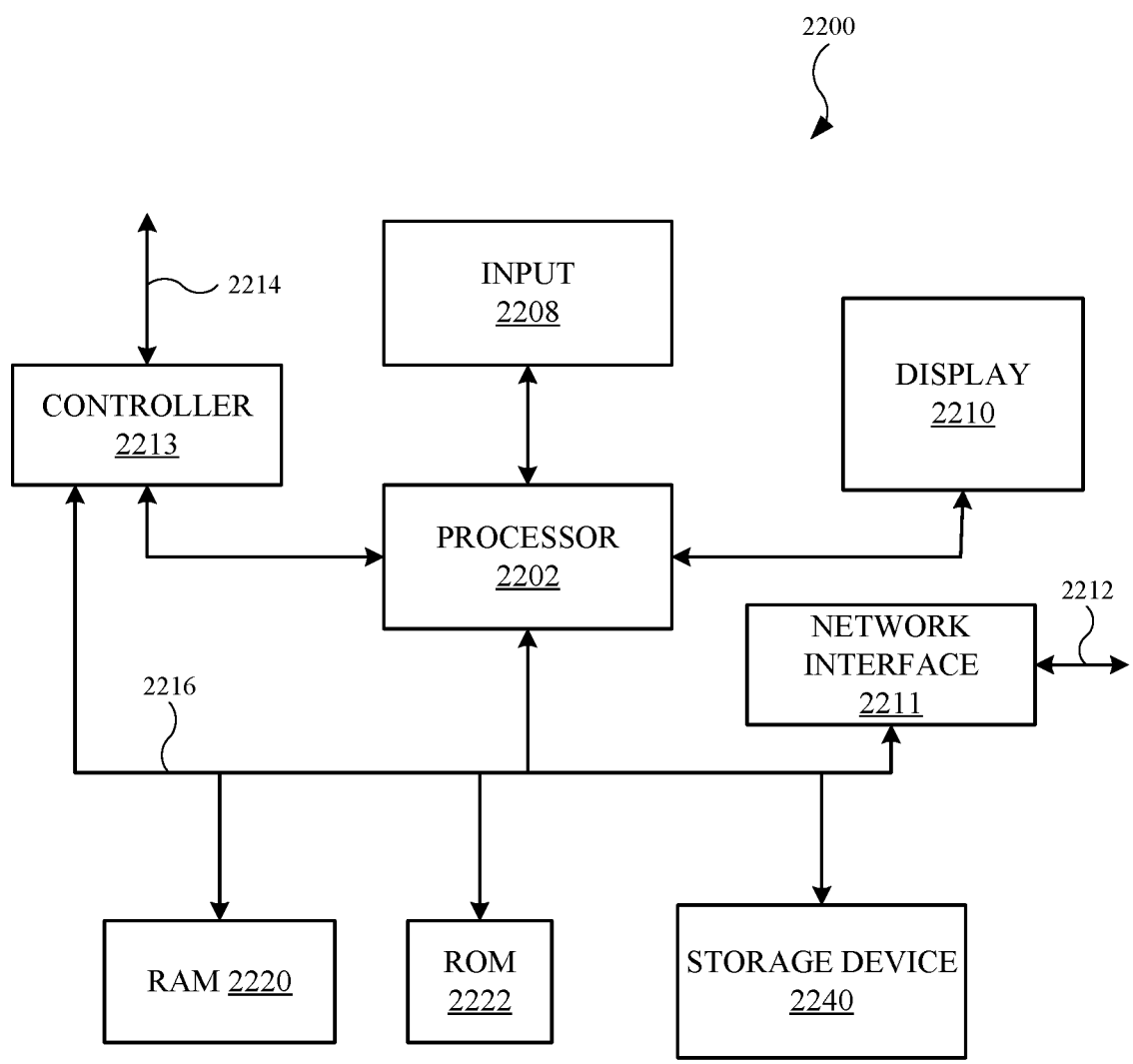
FIG. 38 illustrates a block diagram of an electronic device, in accordance with some described embodiments.

FIG. 38 illustrates a block diagram of an electronic device 2200 some described embodiments. At least some components shown for the electronic device 2200 in the block diagram may be incorporated into computing systems described herein.

As shown in FIG. 38, the electronic device 2200 can include a processor 2202 that represents a microprocessor or controller for controlling the overall operation of electronic device 2200. The electronic device 2200 can also include inputs 2208. Some of the inputs 2208 allow a user of the electronic device 2200 to interact with the electronic device 2200. For example, the inputs 2208 can take the form of a variety of user input devices, such as a button, a keypad, a dial, touch screen, audio input interface, visual/image capture input interface, input in the form of sensor data, etc. Still further, the electronic device 2200 can include a display 2210 (screen display) that can be controlled by the processor 2202 to present visual information to the user. A data bus 2216 can facilitate data transfer between at least a storage device 2240, the processor 2202, and a controller 2213. The controller 2213 can be used to interface with and control different equipment through an equipment control bus 2214. The electronic device 2200 can also include a network/bus interface 22 that couples to a data link 2212. In the case of a wireless connection, the network/bus interface 2211 can include a wireless transceiver.

The electronic device 2200 also includes a storage device 2240, which may include a single disk or multiple disks (e.g., hard drives), and includes a storage management module that manages one or more partitions within the storage device 2240. In some embodiments, storage device 2240 can include flash memory, semiconductor (solid state) memory or the like. The electronic device 2200 can also include a Random Access Memory (RAM) 2220 and a Read-Only Memory (ROM) 2222. The ROM 2222 can store programs, utilities or processes to be executed in a non-volatile manner. The RAM 2220 can provide volatile data storage, and stores instructions related to the operation of the electronic device 2200.

The electronic device 2200 also includes a storage device 2240, which may include a single disk or multiple disks (e.g., hard drives), and includes a storage management module that manages one or more partitions within the storage device 2240. In some embodiments, storage device 2240 can include flash memory, semiconductor (solid state) memory or the like. The electronic device 2200 can also include a Random Access Memory (RAM) 2220 and a Read-Only Memory (ROM) 2222. The ROM 2222 can store programs, utilities or processes to be executed in a non-volatile manner. The RAM 2220 can provide volatile data storage, and stores instructions related to the operation of the electronic device 2200.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A rack system, comprising:
    support structures;
    a housing attached to the support structures, the housing comprising:
        a first housing component; and
        a second housing component coupled to the first housing component by a first latch assembly, the second housing component comprising an opening;
    a computing assembly located in the housing, the computing assembly comprising:
        a computing system comprising a lid and fans integrated with the lid;
        a circuit board extending from the computing system, the circuit board having a first surface and a second surface opposite the first surface, a first component located on the first surface; and
        a second component located on the second surface, wherein a removal of the computing system from the housing comprises a first access position of the first component on the first surface, and wherein a rotation of the computing assembly comprises a second access position of the second component on the second surface, the second access position different from the first access position; and
    a hatch coupled to the second housing component by a second latch assembly, wherein the hatch is capable of being i) positioned in the opening and ii) removed from the opening.

2. The rack system of claim 1, wherein the computing system that is removable from the housing.

3. The rack system of claim 1, wherein removal of the hatch allows access to at least the first component.

4. The rack system of claim 1, further comprising:
    a first rail coupled to the computing assembly; and
    a second rail coupled to the computing assembly, the first rail and the second rail allowing the rotation of the computing assembly wherein the first rail is coupled to the computing assembly by a first cantilevered coupling mechanism, and wherein the second rail coupled to the computing assembly by a second cantilevered coupling mechanism.

5. The rack system of claim 4, wherein the support structures comprise:
    a first support structure coupled with the first rail; and
    a second support structure coupled with the second rail, wherein the computing assembly is perpendicular, prior to the rotation, with respect to the first support structure and the second support structure, and wherein the computing assembly is parallel, subsequent to the rotation, with respect to the first support structure and the second support structure.

6. The rack system of claim 1, further comprising:
    an air shielding element located on the computing assembly;
    a first electromagnetic interference shield element located on the computing assembly; and
    a second electromagnetic interference shield element located on the housing.

7. A rack system, comprising:
a first support structure having a first rail coupled to a computing system;
a second support structure having a second rail coupled to the computing system;
a housing coupled with the first support structure and the second support structure, the housing comprising:
a first housing component; and
a second housing component coupled to the first housing component by a first latch assembly, the second housing component comprising an opening,
wherein:
a closed position comprises the housing receiving computing system, and
an open position comprises the computing system removed from the housing and capable of rotation with respect to the first support structure and the second support structure, wherein the computing system comprises a circuit board that is perpendicular, prior to the rotation, with respect to the first support structure and the second support structure, and wherein the circuit board is parallel, subsequent to the rotation, with respect to the first support structure and the second support structure; and
a hatch coupled to the second housing component by a second latch assembly, wherein the hatch is capable of being i) positioned in the opening and ii) removed from the opening.

8. The rack system of claim 7, wherein;
the circuit board is perpendicular, prior to the rotation, with respect to the first support structure and the second support structure, and
the circuit board is parallel, subsequent to the rotation, with respect to the first support structure and the second support structure.

9. The rack system of claim 8, wherein:
the circuit board comprises a first surface and a second surface opposite the first surface,
subsequent to the rotation, the first surface faces toward the first support structure and the second support structure.

10. The rack system of claim 9, wherein, subsequent to the rotation, the second surface faces away from the first support structure and the second support structure.

11. The rack system of claim 9, wherein the circuit board comprises:
processing circuitry located on the first surface; and
a memory module located on the second surface.

12. The rack system of claim 7, wherein the closed position comprises the computing system positioned between the first support structure and the second support structure.

13. The rack system of claim 7, wherein the housing comprises metal and forms an electromagnetic interference shield element.

14. The rack system of claim 7, wherein the rotation comprises a 180-degree rotation with respect to the first rail and the second rail.

15. The rack system of claim 7, further comprising:
a front panel; and
a latch assembly that couples the front panel with the housing, wherein the latch assembly is capable of i) locking the latch assembly with the front panel, and ii) locking out the computing system from the housing.

16. A rack system, comprising:
a first support structure having a first rail;
a second support structure having a second rail;
a housing coupled to the first support structure and the second support structure, the housing comprising:
a first housing component; and
a second housing component coupled to the first housing component by a first latch assembly, the second housing component comprising an opening;
a computing system that is capable of removal from the housing, the computing system comprising a circuit board having a first surface and a second surface opposite the first surface, the computing system rotationally coupled with the first rail and the second rail to provide i) a first access position to a first component on the first surface, and ii) a second access position to a second component on the second surface, the second access position defined by a 180-degree rotation relative to the first access position; and
a hatch coupled to the second housing component by a second latch assembly, wherein the hatch is capable of being i) positioned in the opening and ii) removed from the opening.

17. The rack system of claim 16, wherein the housing comprises metal and forms an electromagnetic interference shield element.

18. The rack system of claim 16, wherein the computing system rotationally coupled with the first rail and the second rail such that the computing system is capable of 180-degree rotation with respect to the first rail and the second rail.

19. The rack system of claim 16, wherein the first component comprises a processing circuit, and wherein the second component comprises a memory module.

* * * * *

UNITED STATES PATENT AND TRADEMARK OFFICE
CERTIFICATE OF CORRECTION

PATENT NO. : 11,071,228 B2  
APPLICATION NO. : 16/583155  
DATED : July 20, 2021  
INVENTOR(S) : Daniel D. Hershey et al.

Page 1 of 1

It is certified that error appears in the above-identified patent and that said Letters Patent is hereby corrected as shown below:

In the Claims

Column 20, Line 39 (Claim 2): Remove "that".

Signed and Sealed this
Sixteenth Day of August, 2022

Katherine Kelly Vidal
*Director of the United States Patent and Trademark Office*